(12) United States Patent
Huffman et al.

(10) Patent No.: US 8,409,900 B2
(45) Date of Patent: Apr. 2, 2013

(54) FABRICATING MEMS COMPOSITE TRANSDUCER INCLUDING COMPLIANT MEMBRANE

(75) Inventors: James D. Huffman, Pittsford, NY (US); Maria J. Lehmann, Spencerport, NY (US)

(73) Assignee: Eastman Kodak Company, Rochester, NY (US)

( * ) Notice: Subject to any disclaimer, the term of this patent is extended or adjusted under 35 U.S.C. 154(b) by 106 days.

(21) Appl. No.: 13/089,532

(22) Filed: Apr. 19, 2011

(65) Prior Publication Data

US 2012/0270352 A1 Oct. 25, 2012

(51) Int. Cl.
*H01L 21/02* (2006.01)

(52) U.S. Cl. .......... 438/50; 438/51; 438/52; 438/53; 257/E21.002

(58) Field of Classification Search .......... 438/50–53; 257/E21.02
See application file for complete search history.

(56) References Cited

U.S. PATENT DOCUMENTS

| | | | |
|---|---|---|---|
| 6,464,347 B2 | 10/2002 | Kneezel et al. | |
| 6,474,787 B1 | 11/2002 | Cruz-Uribe | |
| 6,561,627 B2 | 5/2003 | Jarrold et al. | |
| 6,857,501 B1 | 2/2005 | Han et al. | |
| 7,268,647 B2 * | 9/2007 | Sano et al. | 333/187 |
| 7,571,992 B2 | 8/2009 | Jia et al. | |
| 7,781,249 B2 * | 8/2010 | Laming et al. | 438/51 |
| 8,309,386 B2 * | 11/2012 | Weigold | 438/53 |
| 2005/0210988 A1 * | 9/2005 | Amano et al. | 73/704 |
| 2005/0242687 A1 | 11/2005 | Kawakubo et al. | |
| 2007/0196946 A1 * | 8/2007 | Kasai et al. | 438/50 |
| 2007/0284682 A1 * | 12/2007 | Laming et al. | 257/416 |
| 2008/0048278 A1 * | 2/2008 | Hishinuma et al. | 257/415 |
| 2009/0107243 A1 | 4/2009 | Sugiura et al. | |

* cited by examiner

*Primary Examiner* — Angel Roman
(74) *Attorney, Agent, or Firm* — William R. Zimmerli

(57) ABSTRACT

A method of fabricating a MEMS composite transducer includes providing a substrate having a first surface and a second surface opposite the first surface. A transducing material is deposited over the first surface of the substrate. The transducing material is patterned by retaining transducing material in a first region and removing transducing material in a second region. A polymer layer is deposited over the first region and the second region. The polymer layer is patterned by retaining polymer in a third region and removing polymer in a fourth region. A first portion of the third region is coincident with a portion of the first region and a second portion of the third region is coincident with a portion of the second region. A cavity is etched from the second surface to the first surface of the substrate. An outer boundary of the cavity at the first surface of the substrate intersects the first region where transducing material is retained, so that a first portion of the transducing material is anchored to the first surface of the substrate and a second portion of the transducing material extends over at least a portion of the cavity.

34 Claims, 19 Drawing Sheets

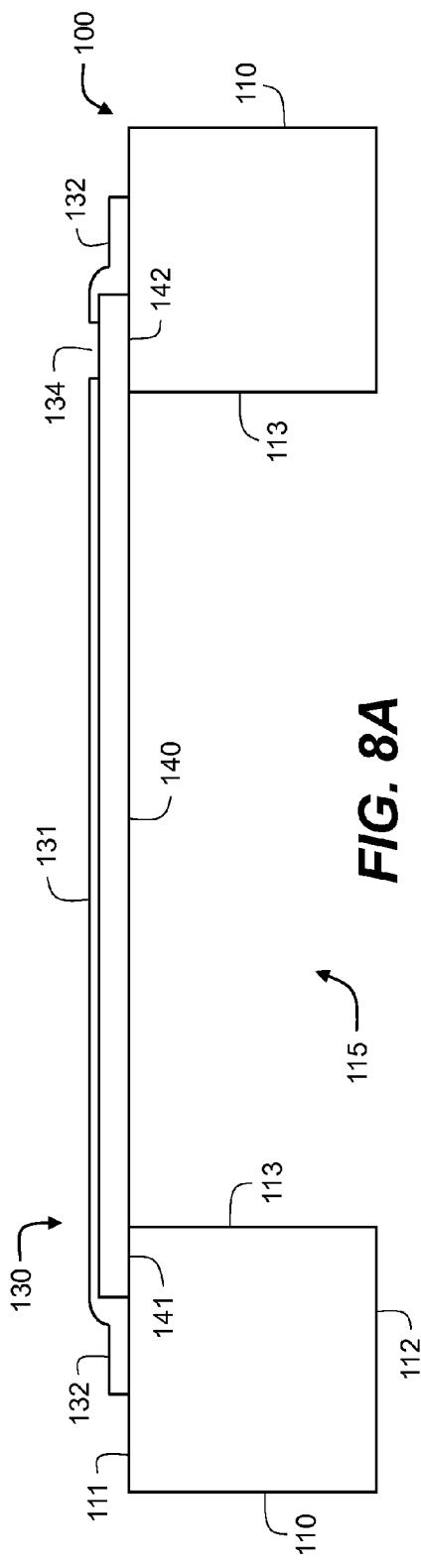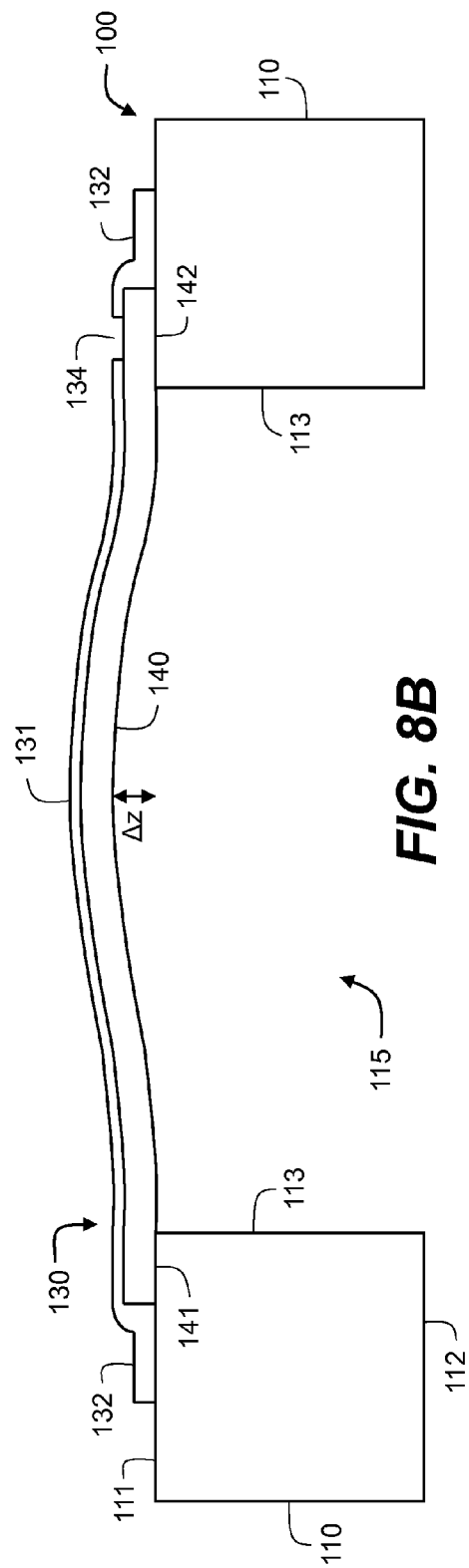

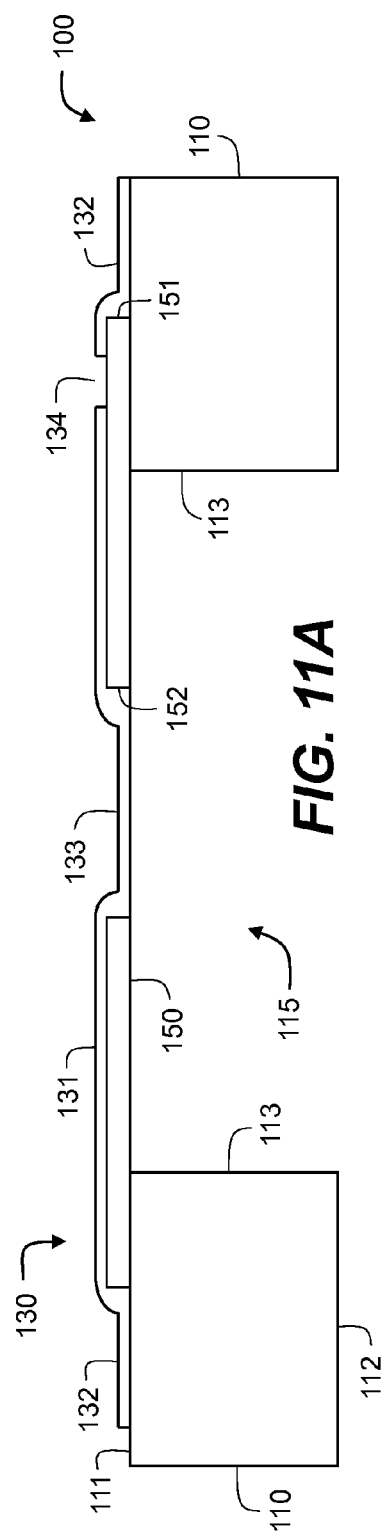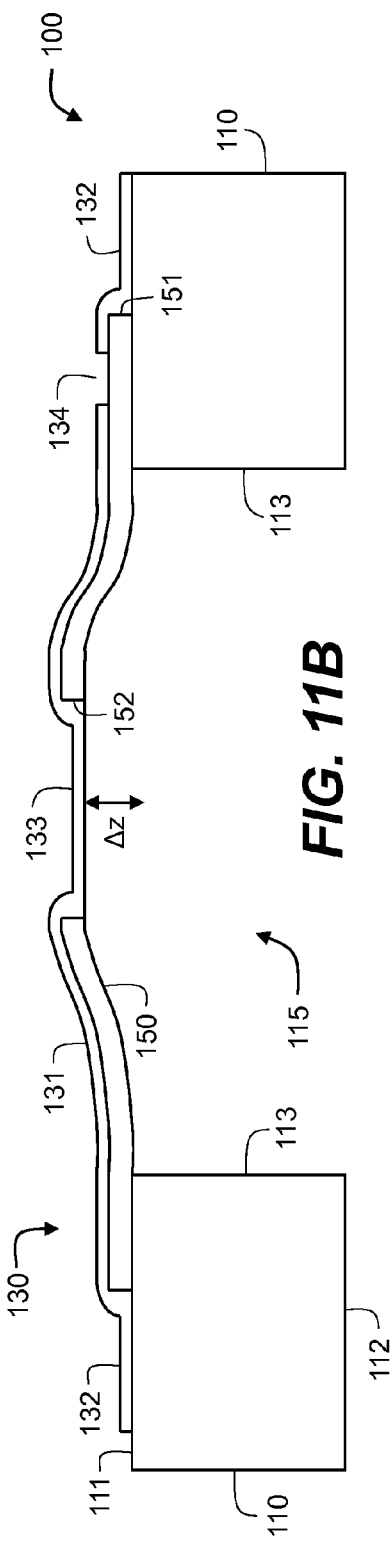

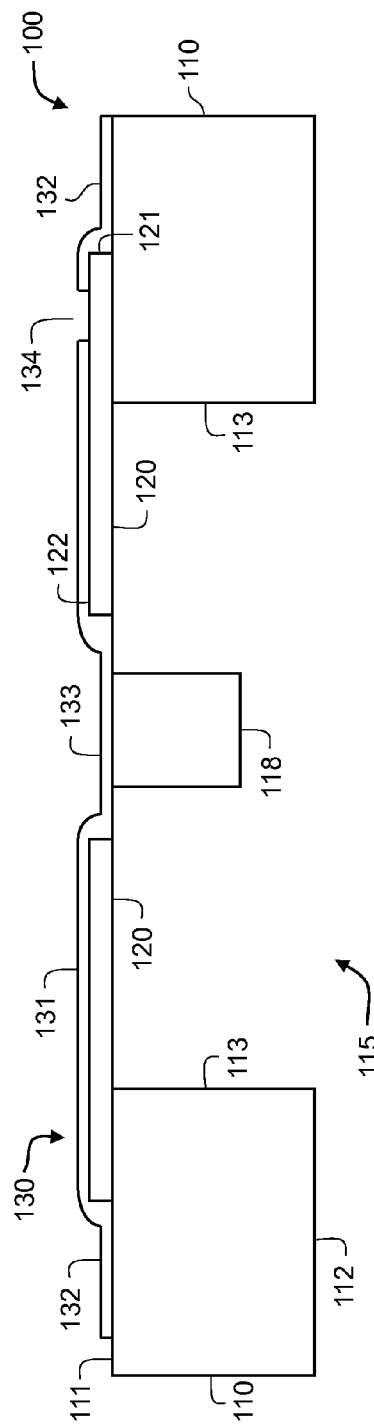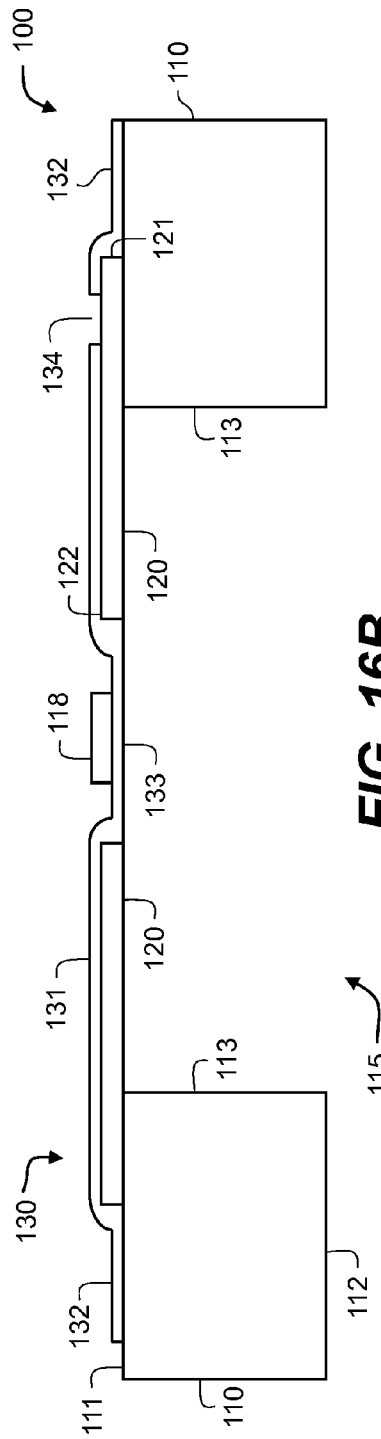

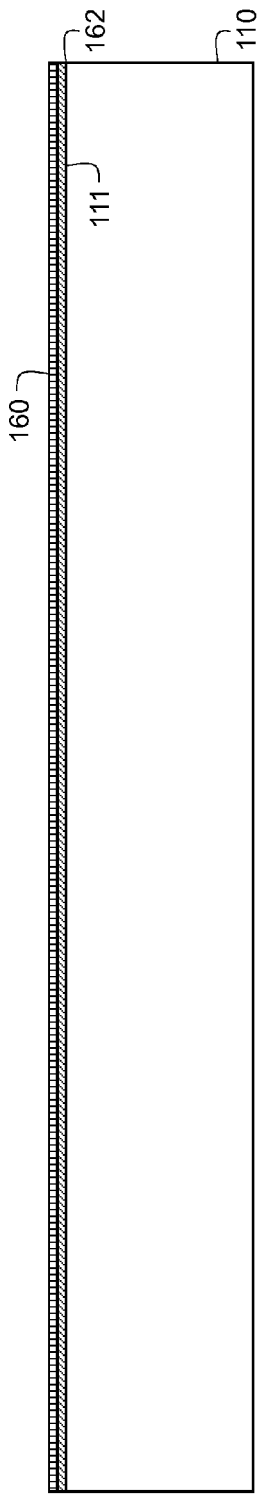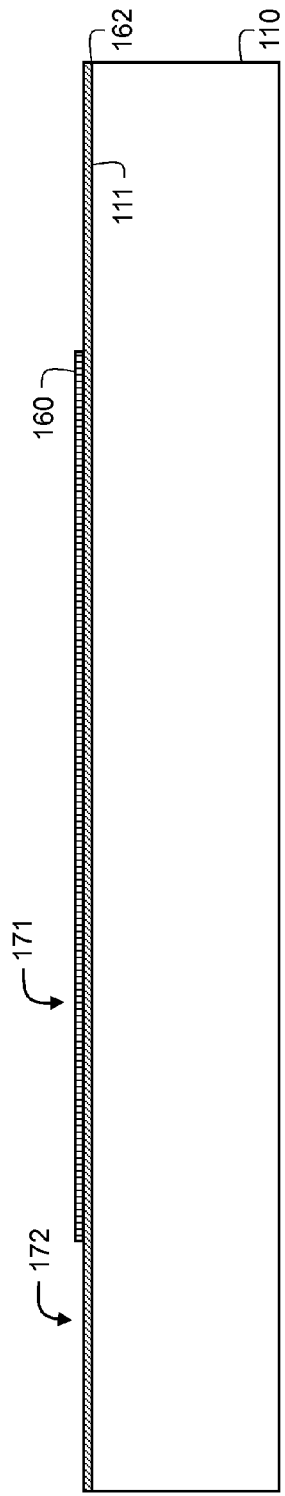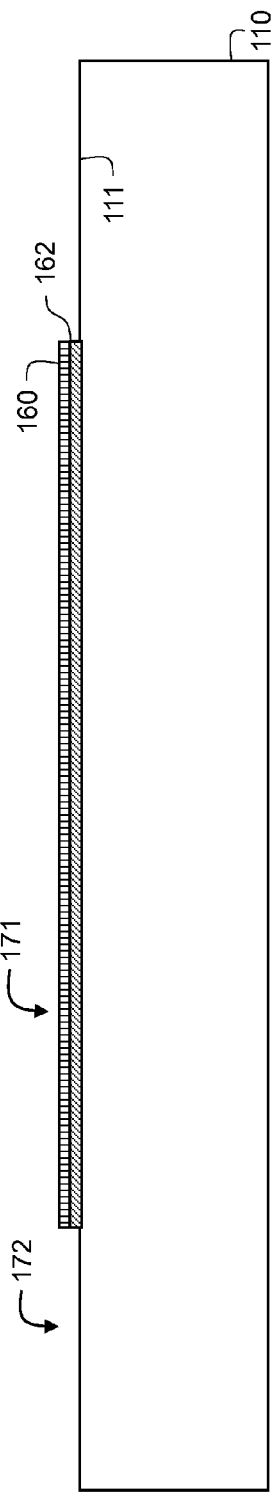

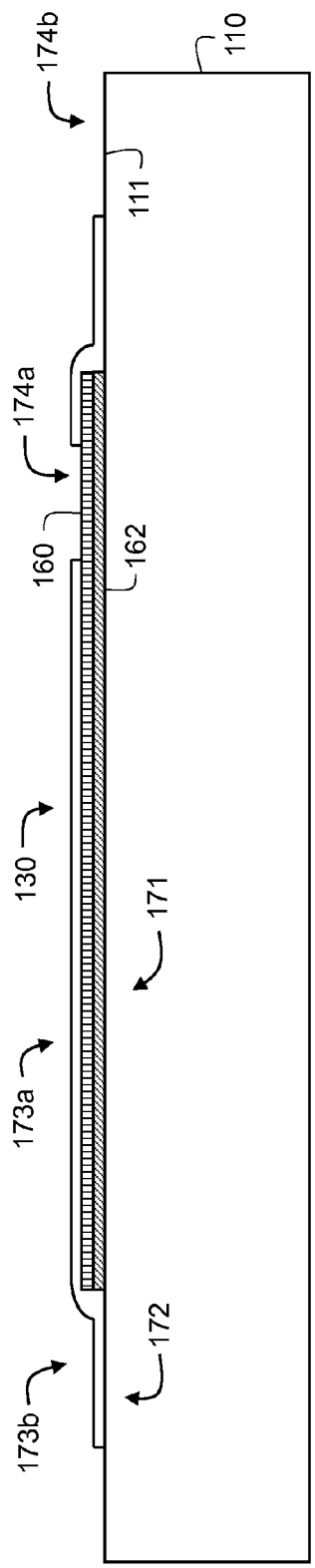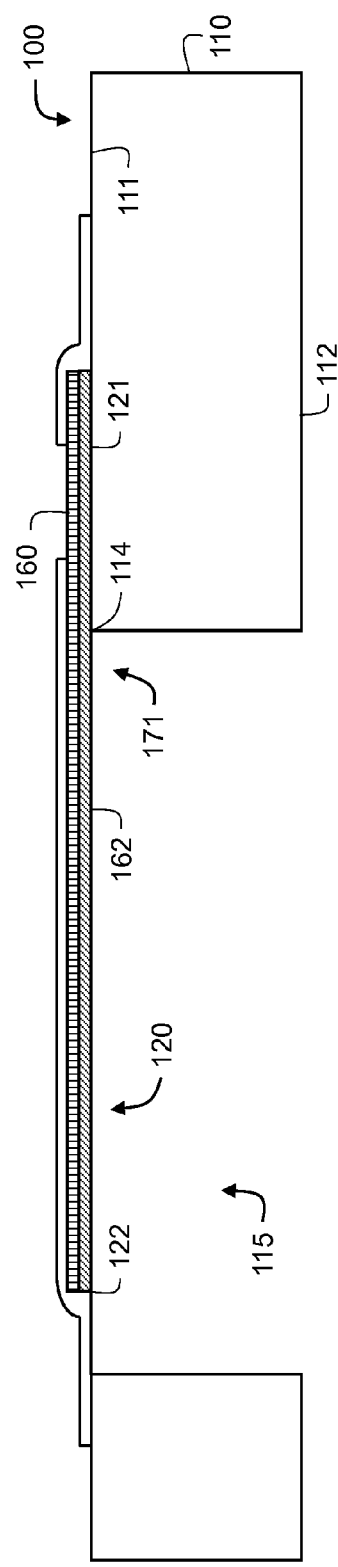

FABRICATING MEMS COMPOSITE TRANSDUCER INCLUDING COMPLIANT MEMBRANE

CROSS REFERENCE TO RELATED APPLICATIONS

Reference is made to commonly-assigned, U.S. patent application Ser. No. 13/089,541, entitled "MEMS COMPOSITE TRANSDUCER INCLUDING COMPLIANT MEMBRANE", filed concurrently herewith.

FIELD OF THE INVENTION

This invention relates generally to Micro-Electro-Mechanical Systems (commonly referred to as MEMS), and in particular, to MEMS transducers that convert energy from one form to another.

BACKGROUND OF THE INVENTION

Micro-Electro-Mechanical Systems (or MEMS) devices are becoming increasingly prevalent as low-cost, compact devices having a wide range of applications. Uses include pressure sensors, accelerometers, gyroscopes, microphones, digital mirror displays, microfluidic devices, biosensors, chemical sensors, and others.

MEMS transducers include both actuators and sensors. In other words they typically convert an electrical signal into a motion, or they convert a motion into an electrical signal. They are typically made using standard thin film and semiconductor processing methods. As new designs, methods and materials are developed, the range of usages and capabilities of MEMS devices can be extended.

MEMS transducers are typically characterized as being anchored to a substrate and extending over a cavity in the substrate. Three general types of such transducers include a) a cantilevered beam having a first end anchored and a second end cantilevered over the cavity; b) a doubly anchored beam having both ends anchored to the substrate on opposite sides of the cavity; and c) a clamped sheet that is anchored around the periphery of the cavity. Type c) is more commonly called a clamped membrane, but the word membrane will be used in a different sense herein, so the term clamped sheet is used to avoid confusion.

Sensors and actuators can be used to sense or provide a displacement or a vibration. For example, the amount of deflection δ of the end of a cantilever in response to a stress σ is given by Stoney's formula $$\delta = 3\sigma(1-\nu)L^2/Et^2 \quad (1),$$

where $\nu$ is Poisson's ratio, $E$ is Young's modulus, $L$ is the beam length, and $t$ is the thickness of the cantilevered beam. In order to increase the amount of deflection for a cantilevered beam, one can use a longer beam length, a smaller thickness, a higher stress, a lower Poisson's ratio, or a lower Young's modulus. The resonant frequency of vibration of an undamped cantilevered beam is given by $$f = \omega_0/2\pi = (k/m)^{1/2}/2\pi \quad (2),$$

where $k$ is the spring constant and $m$ is the mass. For a cantilevered beam of constant width $w$, the spring constant $k$ is given by $$k = Ewt^3/4L^3 \quad (3).$$

It can be shown that the dynamic mass $m$ of an oscillating cantilevered beam is approximately one quarter of the actual mass of $\rho wtL$ ($\rho$ being the density of the beam material), so that within a few percent, the resonant frequency of vibration of an undamped cantilevered beam is approximately $$f \sim (t/2\pi L^2)(E/\rho)^{1/2} \quad (4).$$

For a lower resonant frequency one can use a smaller Young's modulus, a smaller thickness, a longer length, or a larger density. A doubly anchored beam typically has a lower amount of deflection and a higher resonant frequency than a cantilevered beam having comparable geometry and materials. A clamped sheet typically has an even lower amount of deflection and an even higher resonant frequency.

Based on material properties and geometries commonly used for MEMS transducers the amount of deflection can be limited, as can the frequency range, so that some types of desired usages are either not available or do not operate with a preferred degree of energy efficiency, spatial compactness, or reliability. For example, using typical thin film transducer materials for an undamped cantilevered beam of constant width, Equation 4, indicates that a resonant frequency of several megahertz is obtained for a beam having a thickness of 1, to 2, microns and a length of around 20, microns. However, to obtain a resonant frequency of 1, kHz for a beam thickness of about 1, micron, a length of around 750, microns would be required. Not only is this undesirably large, a beam of this length and thickness can be somewhat fragile. In addition, typical MEMS transducers operate independently. For some applications independent operation of MEMS transducers is not able to provide the range of performance desired. Further, typical MEMS transducer designs do not provide a sealed cavity which can be beneficial for some fluidic applications.

What is needed is a MEMS transducer design and method of fabrication to enable low cost actuators or sensors having improved volumetric displacement, extended range of frequency sensitivity, or improved reliability.

SUMMARY OF THE INVENTION

According to an aspect of the invention, a method of fabricating a MEMS composite transducer includes providing a substrate having a first surface and a second surface opposite the first surface. A transducing material is deposited over the first surface of the substrate. The transducing material is patterned by retaining transducing material in a first region and removing transducing material in a second region. A polymer layer is deposited over the first region and the second region. The polymer layer is patterned by retaining polymer in a third region and removing polymer in a fourth region. A first portion of the third region is coincident with a portion of the first region and a second portion of the third region is coincident with a portion of the second region. A cavity is etched from the second surface to the first surface of the substrate. An outer boundary of the cavity at the first surface of the substrate intersects the first region where transducing material is retained, so that a first portion of the transducing material is anchored to the first surface of the substrate and a second portion of the transducing material extends over at least a portion of the cavity.

BRIEF DESCRIPTION OF THE DRAWINGS

In the detailed description of the example embodiments of the invention presented below, reference is made to the accompanying drawings, in which:

FIG. 8A is a cross-sectional view of the MEMS composite transducer of FIG. 7 in its undeflected state;

FIG. 8B is a cross-sectional view of the MEMS composite transducer of FIG. 7 in its deflected state;

FIG. 11A is a cross-sectional view of the MEMS composite transducer of FIG. 10 in its undeflected state;

FIG. 11B is a cross-sectional view of the MEMS composite transducer of FIG. 10 in its deflected state;

FIG. 16A is a cross-sectional view of an embodiment similar to that of FIG. 6, but also including an attached mass that extends into the cavity;

FIG. 16B is a cross-sectional view of an embodiment similar to that of FIG. 16A, but where the attached mass is on the opposite side of the compliant membrane;

FIGS. 17A to 17E illustrate an overview of a method of fabrication; and

DETAILED DESCRIPTION OF THE INVENTION

The present description will be directed in particular to elements forming part of, or cooperating more directly with, apparatus in accordance with the present invention. It is to be understood that elements not specifically shown or described may take various forms well known to those skilled in the art.

Embodiments of the present invention include a variety of types of MEMS transducers including a MEMS transducing member and a compliant membrane positioned in contact with the MEMS transducing member. It is to be noted that in some definitions of MEMS structures, MEMS components are specified to be between 1, micron and 100, microns in size. Although such dimensions characterize a number of embodiments, it is contemplated that some embodiments will include dimensions outside that range.

Figures 1A, 1B:
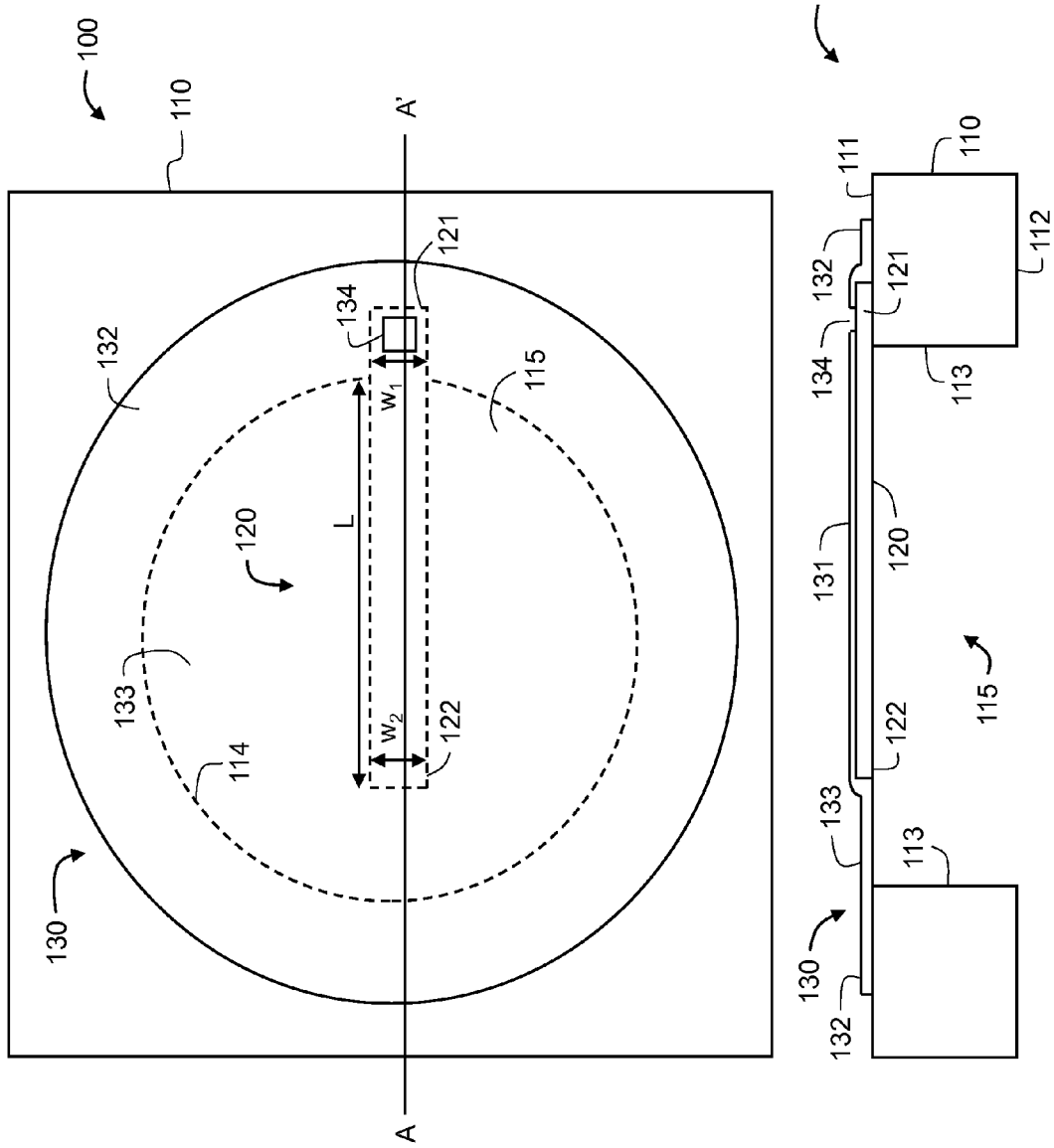
FIG. 1A is a top view and FIG. 1B is a cross-sectional view of an embodiment of a MEMS composite transducer including a cantilevered beam and a compliant membrane over a cavity.

FIG. 1A shows a top view and FIG. 1B shows a cross-sectional view (along A-A') of a first embodiment of a MEMS composite transducer 100, where the MEMS transducing member is a cantilevered beam 120 that is anchored at a first end 121 to a first surface 111 of a substrate 110. Portions 113 of the substrate 110 define an outer boundary 114 of a cavity 115. In the example of FIGS. 1A and 1B, the cavity 115 is substantially cylindrical and is a through hole that extends from a first surface 111 of substrate 110 (to which a portion of the MEMS transducing member is anchored) to a second surface 112 that is opposite first surface 111. Other shapes of cavity 115 are contemplated for other embodiments in which the cavity 115 does not extend all the way to the second surface 112. Still other embodiments are contemplated where the cavity shape is not cylindrical with circular symmetry. A portion of cantilevered beam 120 extends over a portion of cavity 115 and terminates at second end 122. The length L of the cantilevered beam extends from the anchored end 121 to the free end 122. Cantilevered beam 120 has a width $w_1$, at first end 121 and a width $w_2$, at second end 122. In the example of FIGS. 1A and 1B, $w_1=w_2$, but in other embodiments described below that is not the case.

MEMS transducers having an anchored beam cantilevering over a cavity are well known. A feature that distinguishes the MEMS composite transducer 100 from conventional devices is a compliant membrane 130 that is positioned in contact with the cantilevered beam 120 (one example of a MEMS transducing member). Compliant membrane includes a first portion 131 that covers the MEMS transducing member, a second portion 132 that is anchored to first surface 111 of substrate 110, and a third portion 133 that overhangs cavity 115 while not contacting the MEMS transducing member. In a fourth region 134, compliant membrane 130 is removed such that it does not cover a portion of the MEMS transducing member near the first end 121 of cantilevered beam 120, so that electrical contact can be made as is discussed in further detail below. In the example shown in FIG. 1B, second portion 132 of compliant membrane 130 that is anchored to substrate 110 is anchored around the outer boundary 114 of cavity 115. In other embodiments, it is contemplated that the second portion 132 would not extend entirely around outer boundary 114.

Figure 2:
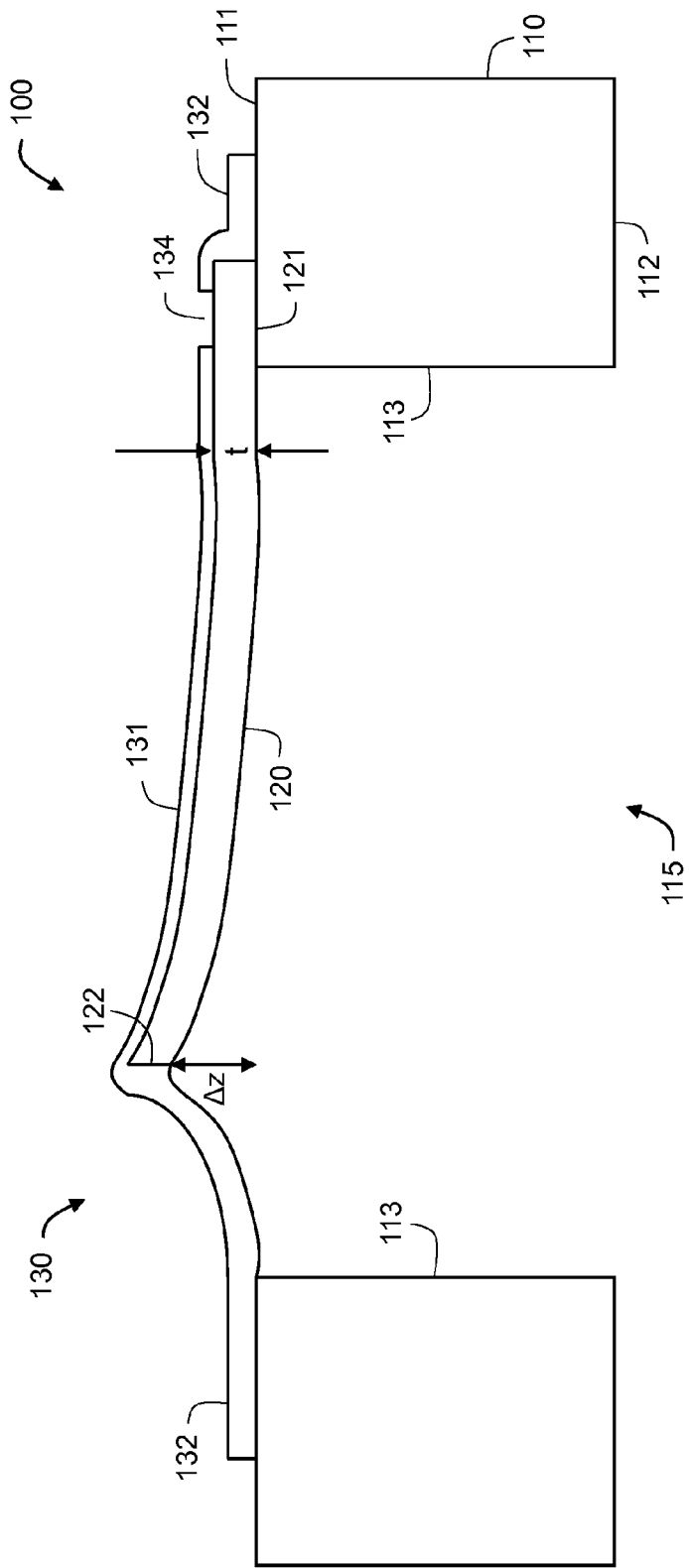
FIG. 2 is a cross-sectional view similar to FIG. 1B, where the cantilevered beam is deflected.

The portion (including end 122) of the cantilevered beam 120 that extends over at least a portion of cavity 115 is free to move relative to cavity 115. A common type of motion for a cantilevered beam is shown in FIG. 2, which is similar to the view of FIG. 1B at higher magnification, but with the cantilevered portion of cantilevered beam 120 deflected upward away by a deflection $\delta=\Delta z$ from the original undeflected position shown in FIG. 1B (the z direction being perpendicular to the x-y plane of the surface 111 of substrate 110). Such a bending motion is provided for example in an actuating mode by a MEMS transducing material (such as a piezoelectric material, or a shape memory alloy, or a thermal bimorph material) that expands or contracts relative to a reference material layer to which it is affixed when an electrical signal is applied, as is discussed in further detail below. When the upward deflection out of the cavity is released (by stopping the electrical signal), the MEMS transducer typically moves from being out of the cavity to into the cavity before it relaxes to its undeflected position. Some types of MEMS transducers have the capability of being driven both into and out of the cavity, and are also freely movable into and out of the cavity.

The compliant membrane 130 is deflected by the MEMS transducer member such as cantilevered beam 120, thereby providing a greater volumetric displacement than is provided by deflecting only cantilevered beam (of conventional devices) that is not in contact with a compliant membrane 130. Desirable properties of compliant membrane 130 are that it have a Young's modulus that is much less than the Young's modulus of typical MEMS transducing materials, a relatively large elongation before breakage, excellent chemical resistance (for compatibility with MEMS manufacturing processes), high electrical resistivity, and good adhesion to the transducer and substrate materials. Some polymers, including some epoxies, are well adapted to be used as a compliant membrane 130. Examples include TMMR liquid resist or TMMF dry film, both being products of Tokyo Ohka Kogyo Co. The Young's modulus of cured TMMR or TMMF is about 2, GPa, as compared to approximately 70, GPa for a silicon oxide, around 100, GPa for a PZT piezoelectric, around 160, GPa for a platinum metal electrode, and around 300, GPa for silicon nitride. Thus the Young's modulus of the typical MEMS transducing member is at least a factor of 10, greater, and more typically more than a factor of 30, greater than that of the compliant membrane 130. A benefit of a low Young's modulus of the compliant membrane is that the design can allow for it to have negligible effect on the amount of deflection for the portion 131 where it covers the MEMS transducing member, but is readily deflected in the portion 133 of compliant membrane 130 that is nearby the MEMS transducing member but not directly contacted by the MEMS transducing member. Furthermore, because the Young's modulus of the compliant membrane 130 is much less than that of the typical MEMS transducing member, it has little effect on the resonant frequency of the MEMS composite transducer 100 if the MEMS transducing member (e.g. cantilevered beam 120) and the compliant membrane 130 have comparable size. However, if the MEMS transducing member is much smaller than the compliant membrane 130, the resonant frequency of the MEMS composite transducer can be significantly lowered. In addition, the elongation before breaking of cured TMMR or TMMF is around 5%, so that it is capable of large deflection without damage.

There are many embodiments within the family of MEMS composite transducers 100 having one or more cantilevered beams 120 as the MEMS transducing member covered by the compliant membrane 130. The different embodiments within this family have different amounts of displacement or different resonant frequencies or different amounts of coupling between multiple cantilevered beams 120 extending over a portion of cavity 115, and thereby are well suited to a variety of applications.

Figure 3:
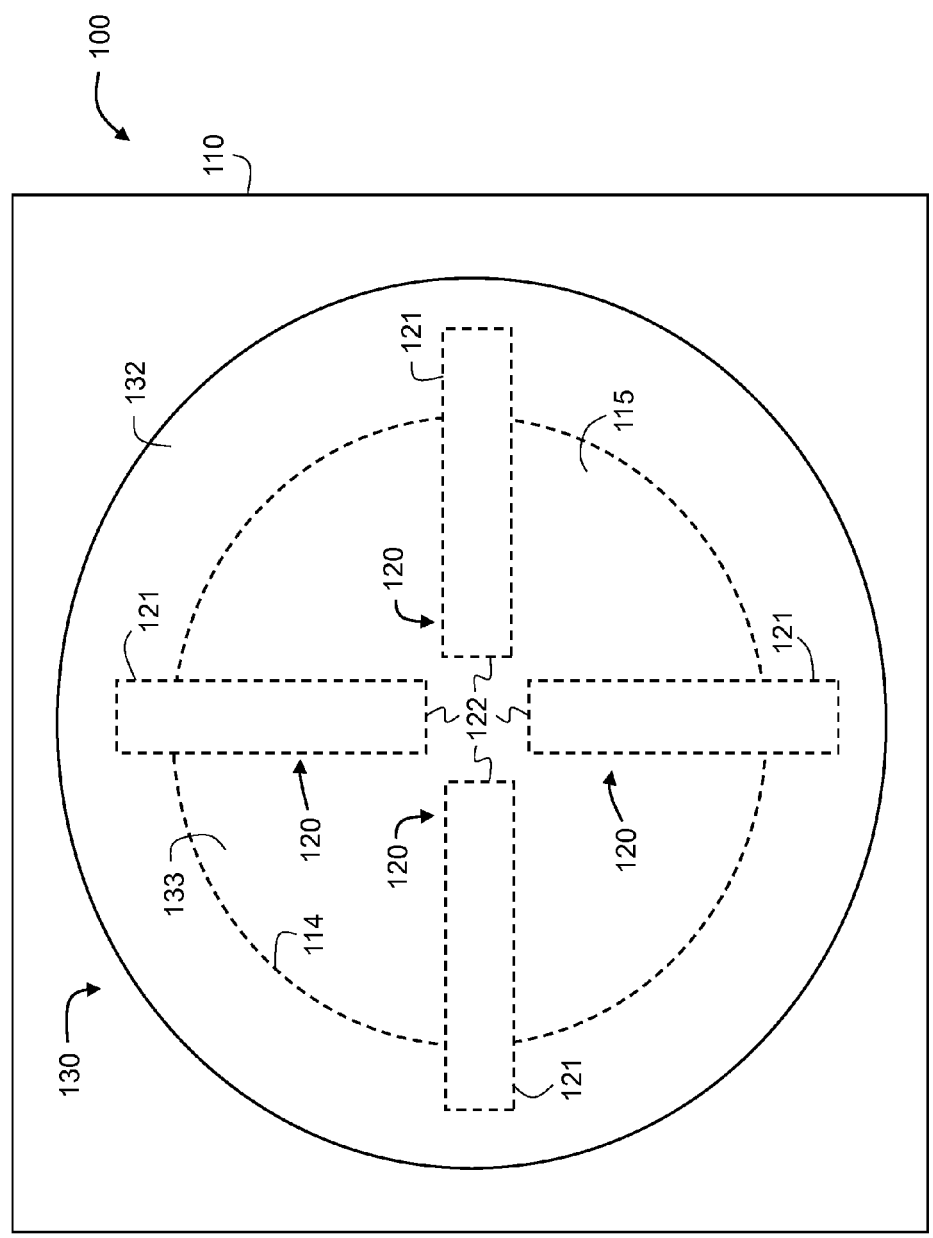
FIG. 3 is a top view of an embodiment similar to FIG. 1A, but with a plurality of cantilevered beams over the cavity.

FIG. 3 shows a top view of a MEMS composite transducer 100 having four cantilevered beams 120 as the MEMS transducing members, each cantilevered beam 120 including a first end that is anchored to substrate 110, and a second end 122 that is cantilevered over cavity 115. For simplicity, some details such as the portions 134 where the compliant membrane is removed are not shown in FIG. 3. In this example, the widths $w_1$, (see FIG. 1A) of the first ends 121 of the cantilevered beams 120 are all substantially equal to each other, and the widths $w_2$ (see FIG. 1A) of the second ends 122 of the cantilevered beams 120 are all substantially equal to each other. In addition, $w_1=w_2$, in the example of FIG. 3. Compliant membrane 130 includes first portions 131 that cover the cantilevered beams 120 (as seen more clearly in FIG. 1B), a second portion 132 that is anchored to substrate 110, and a third portion 133 that overhangs cavity 115 while not contacting the cantilevered beams 120. The compliant member 130 in this example provides some coupling between the different cantilevered beams 120. In addition, for embodiments where the cantilevered beams are actuators, the effect of actuating all four cantilevered beams 120 results in an increased volumetric displacement and a more symmetric displacement of the compliant membrane 130 than the single cantilevered beam 120 shown in FIGS. 1A, 1B and 2.

Figure 4:
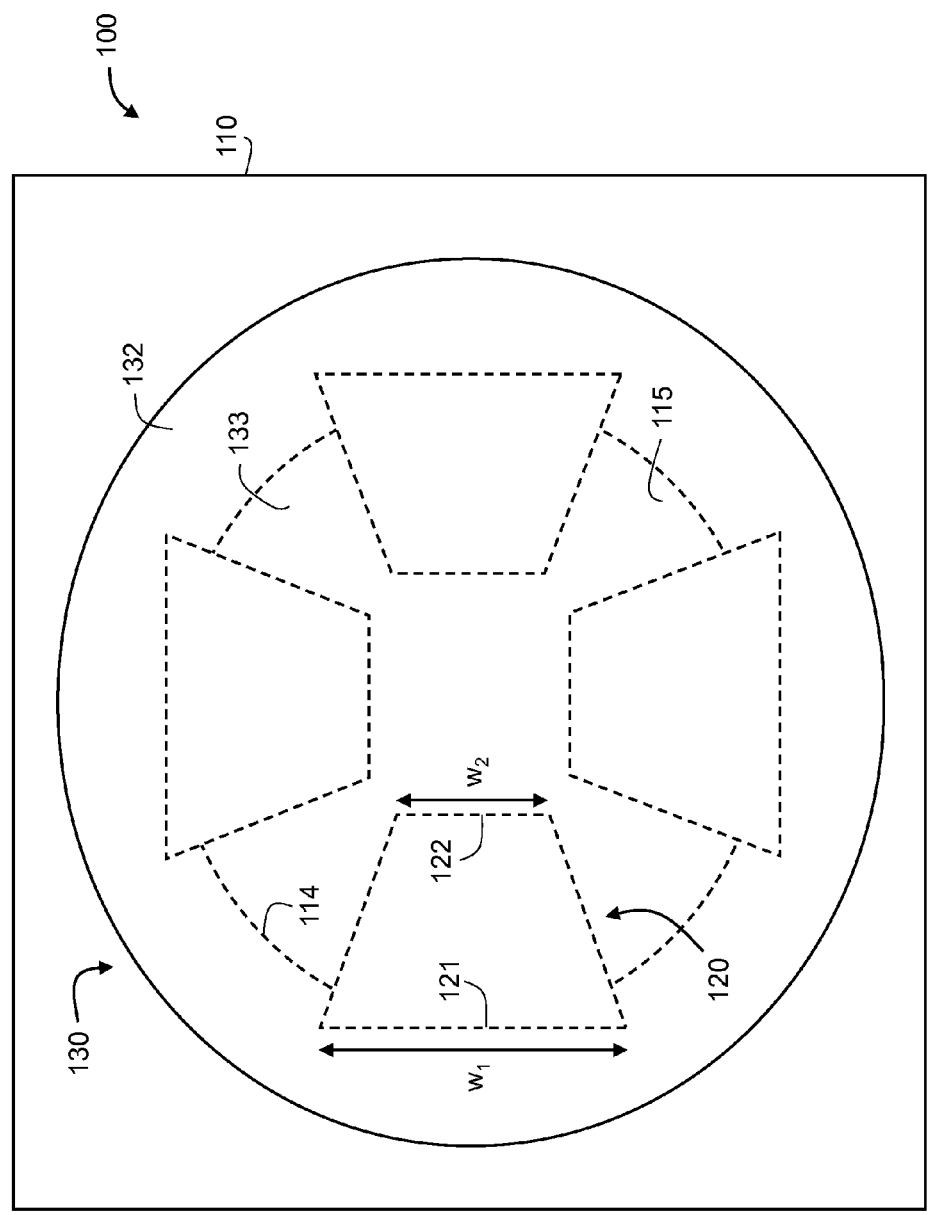
FIG. 4 is a top view of an embodiment similar to FIG. 3, but where the widths of the cantilevered beams are larger at their anchored ends than at their free ends.

FIG. 4 shows an embodiment similar to FIG. 3, but for each of the four cantilevered beams 120, the width $w_1$, at the anchored end 121 is greater than the width $w_2$, at the cantilevered end 122. For embodiments where the cantilevered beams 120 are actuators, the effect of actuating the cantilevered beams of FIG. 4 provides a greater volumetric displacement of compliant membrane 130, because a greater portion of the compliant membrane is directly contacted and supported by cantilevered beams 120. As a result the third portion 133 of compliant membrane 130 that overhangs cavity 115 while not contacting the cantilevered beams 120 is smaller in FIG. 4 than in FIG. 3. This reduces the amount of sag in third portion 133 of compliant membrane 130 between cantilevered beams 120 as the cantilevered beams 120 are deflected.

Figure 5:
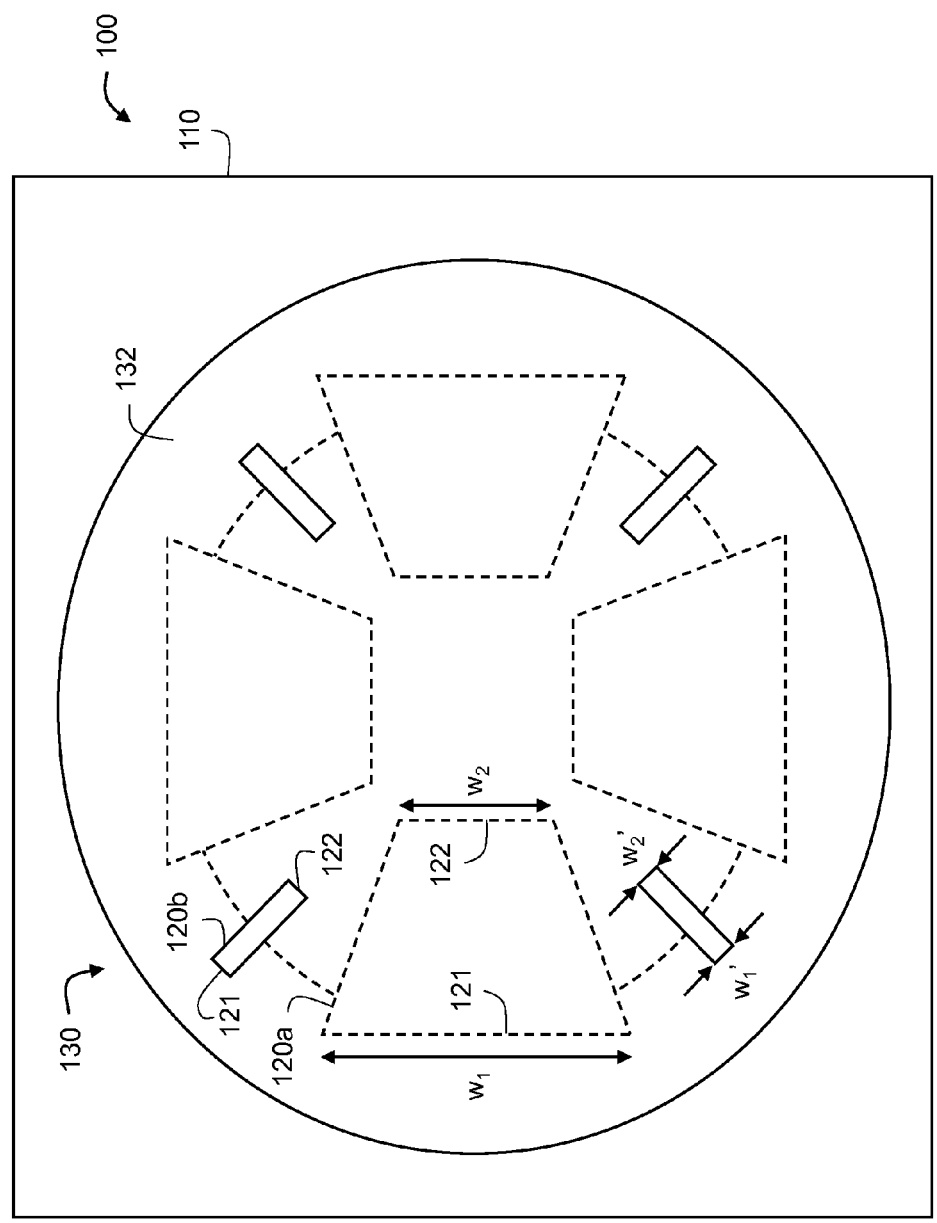
FIG. 5 is a top view of an embodiment similar to FIG. 4, but in addition including a second group of cantilevered beams having a different shape.

FIG. 5 shows an embodiment similar to FIG. 4, where in addition to the group of cantilevered beams 120$a$, (one example of a MEMS transducing member) having larger first widths $w_1$, than second widths $w_2$, there is a second group of cantilevered beams 120$b$, (alternatingly arranged between elements of the first group) having first widths $w_1'$ that are equal to second widths $W_2'$. Furthermore, the second group of cantilevered beams 120$b$, are sized smaller than the first group of cantilevered beams 120$a$, such that the first widths $w_1'$ are smaller than first widths $w_1$, the second widths $w_2'$ are smaller than second widths $w_2$, and the distances (lengths) between the anchored first end 121 and the free second end 122 are also smaller for the group of cantilevered beams 120$b$. Such an arrangement is beneficial when the first group of cantilevered beams 120$a$, are used for actuators and the second group of cantilevered beams 120$b$, are used as sensors.

Figure 6:
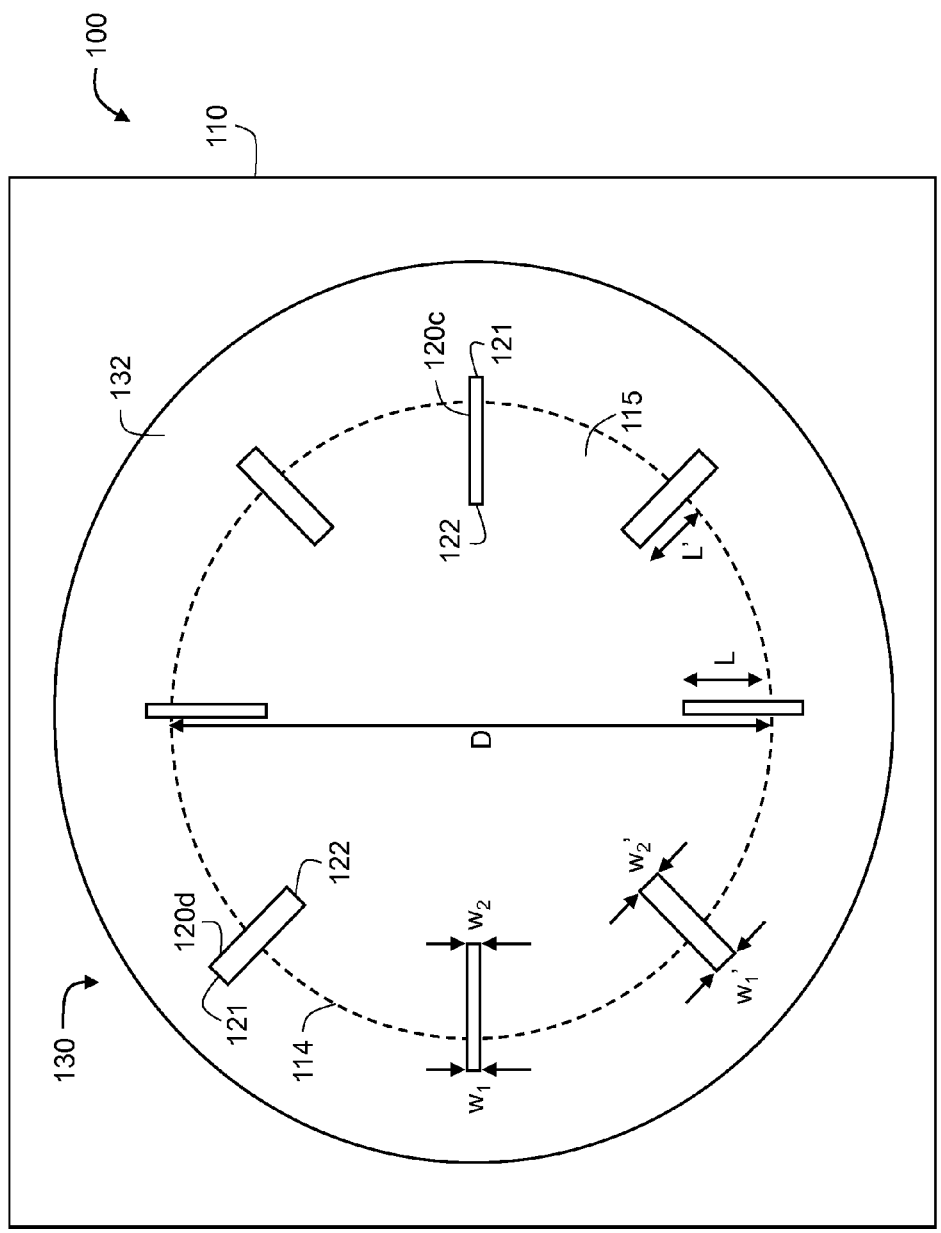
FIG. 6 is a top view of another embodiment including two different groups of cantilevered beams of different shapes.

FIG. 6 shows an embodiment similar to FIG. 5 in which there are two groups of cantilevered beams 120$c$, and 120$d$, with the elements of the two groups being alternatingly arranged. In the embodiment of FIG. 6 however, the lengths L and L' of the cantilevered beams 120$c$, and 120$d$, respectively (the distances from anchored first ends 121 to free second ends 122) are less than 20% of the dimension D across cavity 115. In this particular example, where the outer boundary 114 of cavity 115 is circular, D is the diameter of the cavity 115. In addition, in the embodiment of FIG. 6, the lengths L and L' are different from each other, the first widths $w_1$, and $w_1'$ are different from each other, and the second widths $w_2$, and $w_2'$ are different from each other for the cantilevered beams 120$c$, and 120$d$. Such an embodiment is beneficial when the groups of both geometries of cantilevered beams 120$c$, and 120$d$, are used to convert a motion of compliant membrane 130 to an electrical signal, and it is desired to pick up different amounts of deflection or at different frequencies (see equations 1, 2, and 3, in the background).

In the embodiments shown in FIGS. 1A and 3-6, the cantilevered beams 120 (one example of a MEMS transducing member) are disposed with substantially radial symmetry around a circular cavity 115. This can be a preferred type of configuration in many embodiments, but other embodiments are contemplated having nonradial symmetry or noncircular cavities. For embodiments including a plurality of MEMS transducing members as shown in FIGS. 3-6, the compliant membrane 130 across cavity 115 provides a degree of coupling between the MEMS transducing members. For example, the actuators discussed above relative to FIGS. 4 and 5 can cooperate to provide a larger combined force and a larger volumetric displacement of compliant membrane 130 when compared to a single actuator. The sensing elements (converting motion to an electrical signal) discussed above relative to FIGS. 5 and 6 can detect motion of different regions of the compliant membrane 130.

Figure 7:
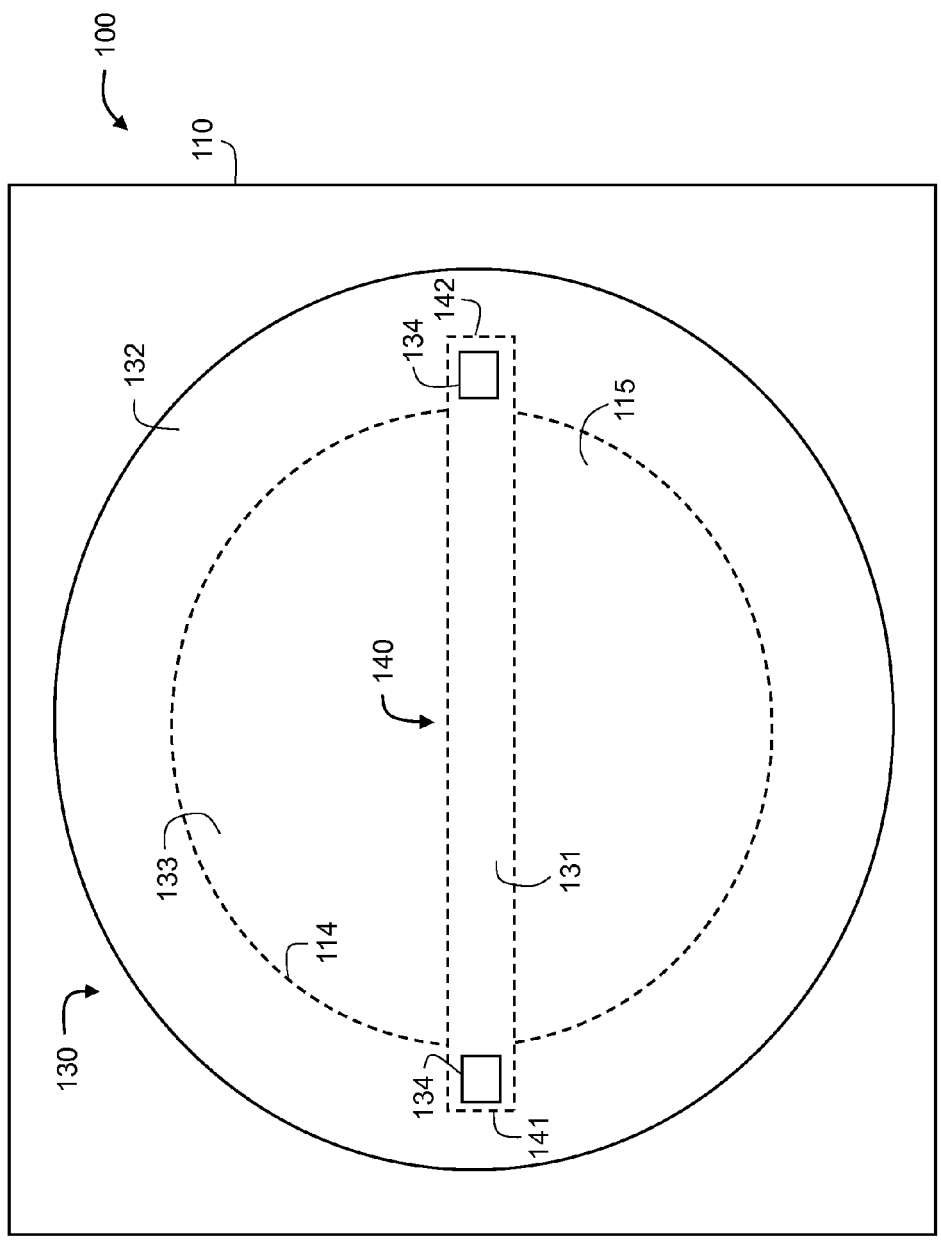
FIG. 7 is a top view of an embodiment where the MEMS composite transducer includes a doubly anchored beam and a compliant membrane.

FIG. 7 shows an embodiment of a MEMS composite transducer in a top view similar to FIG. 1A, but where the MEMS transducing member is a doubly anchored beam 140 extending across cavity 115 and having a first end 141 and a second end 142 that are each anchored to substrate 110. As in the embodiment of FIGS. 1A and 1B, compliant membrane 130 includes a first portion 131 that covers the MEMS transducing member, a second portion 132 that is anchored to first surface 111 of substrate 110, and a third portion 133 that overhangs cavity 115 while not contacting the MEMS transducing member. In the example of FIG. 7, a portion 134 of compliant membrane 130 is removed over both first end 141 and second end 142 in order to make electrical contact in order to pass a current from the first end 141 to the second end 142.

FIG. 8A shows a cross-sectional view of a doubly anchored beam 140 MEMS composite transducer in its undeflected state, similar to the cross-sectional view of the cantilevered beam 120 shown in FIG. 1B. In this example, a portion 134 of compliant membrane 130 is removed only at anchored second end 142 in order to make electrical contact on a top side of the MEMS transducing member to apply (or sense) a voltage across the MEMS transducing member as is discussed in further detail below. Similar to FIGS. 1A and 1B, the cavity 115 is substantially cylindrical and extends from a first surface 111 of substrate 110 to a second surface 112 that is opposite first surface 111.

FIG. 8B shows a cross-sectional view of the doubly anchored beam 140 in its deflected state, similar to the cross-sectional view of the cantilevered beam 120 shown in FIG. 2. The portion of doubly anchored beam 140 extending across cavity 115 is deflected up and away from the undeflected position of FIG. 8A, so that it raises up the portion 131 of compliant membrane 130. The maximum deflection at or near the middle of doubly anchored beam 140 is shown as $\delta=\Delta z$.

Figure 9:
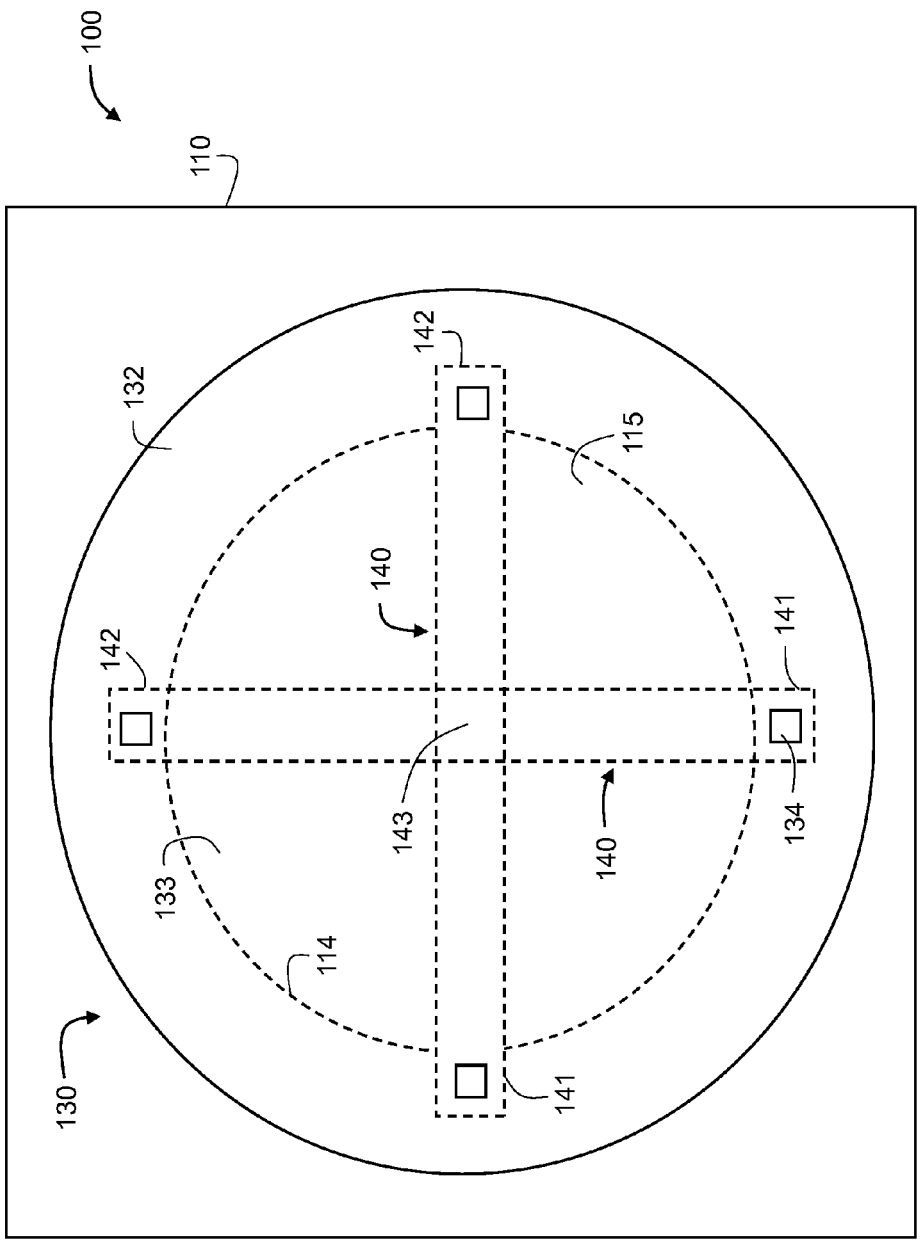
FIG. 9 is a top view of an embodiment where the MEMS composite transducer includes two intersecting doubly anchored beams and a compliant membrane.

FIG. 9 shows a top view of an embodiment similar to that of FIG. 7, but with a plurality (for example, two) of doubly anchored beams 140 anchored to the substrate 110 at their first end 141 and second end 142. In this embodiment both doubly anchored beams 140 are disposed substantially radially across circular cavity 115, and therefore the two doubly anchored beams 140 intersect each other over the cavity at an intersection region 143. Other embodiments are contemplated in which a plurality of doubly anchored beams do not intersect each other or the cavity is not circular. For example, two doubly anchored beams can be parallel to each other and extend across a rectangular cavity.

Figure 10:
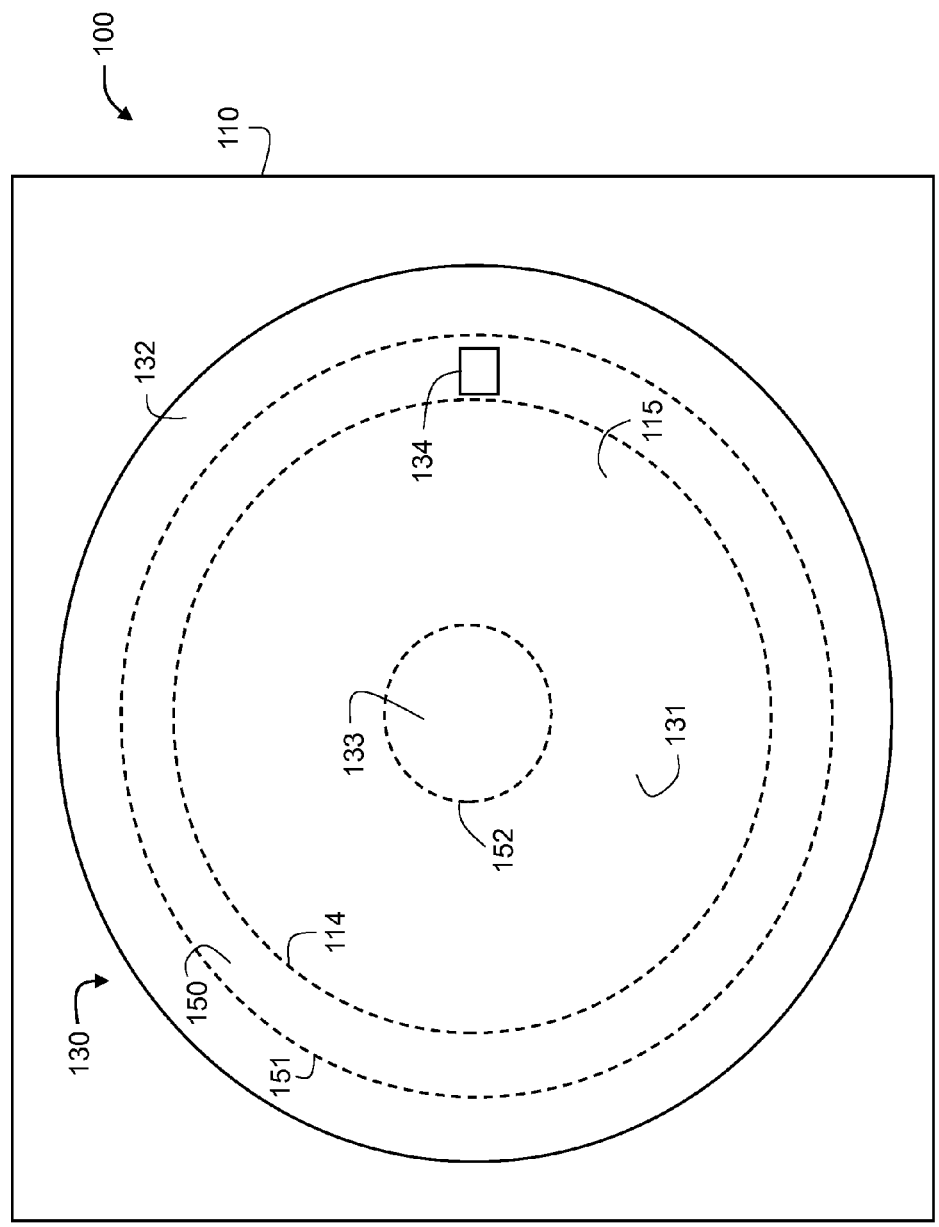
FIG. 10 is a top view of an embodiment where the MEMS composite transducer includes a clamped sheet and a compliant membrane.

FIG. 10 shows an embodiment of a MEMS composite transducer in a top view similar to FIG. 1A, but where the MEMS transducing member is a clamped sheet 150 extending across a portion of cavity 115 and anchored to the substrate 110 around the outer boundary 114 of cavity 115. Clamped sheet 150 has a circular outer boundary 151 and a circular inner boundary 152, so that it has an annular shape. As in the embodiment of FIGS. 1 and 1B, compliant membrane 130 includes a first portion 131 that covers the MEMS transducing member, a second portion 132 that is anchored to first surface 111 of substrate 110, and a third portion 133 that overhangs cavity 115 while not contacting the MEMS transducing member. In a fourth region 134, compliant membrane 130 is removed such that it does not cover a portion of the MEMS transducing member, so that electrical contact can be made as is discussed in further detail below.

FIG. 11A shows a cross-sectional view of a clamped sheet 150 MEMS composite transducer in its undeflected state, similar to the cross-sectional view of the cantilevered beam 120 shown in FIG. 1B. Similar to FIGS. 1A and 1B, the cavity 115 is substantially cylindrical and extends from a first surface 111 of substrate 110 to a second surface 112 that is opposite first surface 111.

FIG. 11B shows a cross-sectional view of the clamped sheet 150 in its deflected state, similar to the cross-sectional view of the cantilevered beam 120 shown in FIG. 2. The portion of clamped sheet 150 extending across cavity 115 is deflected up and away from the undeflected position of FIG. 11A, so that it raises up the portion 131 of compliant membrane 130, as well as the portion 133 that is inside inner boundary 152. The maximum deflection at or near the inner boundary 152 is shown as $\delta=\Delta z$.

Figure 12A:
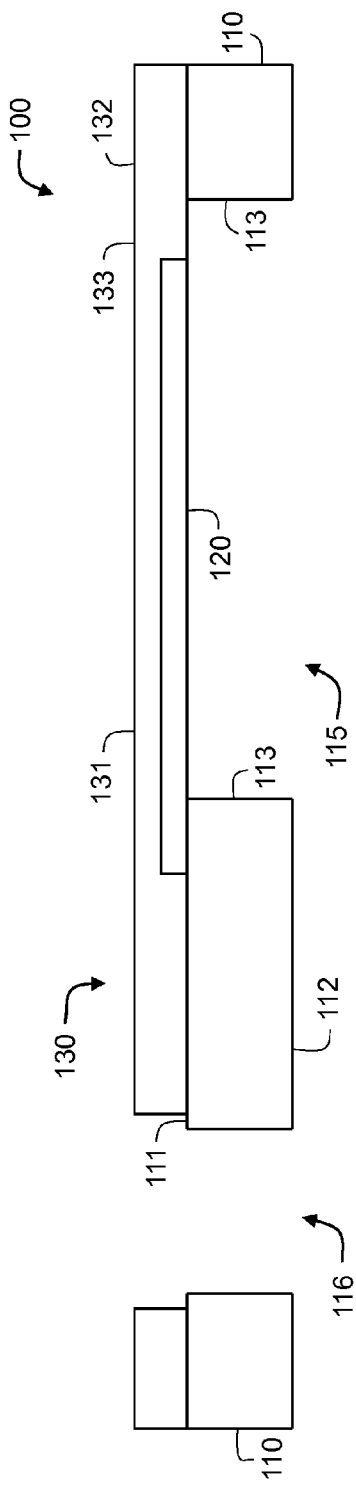
FIG. 12A is a cross-sectional view of an embodiment similar to that of FIG. 1A, but also including an additional through hole in the substrate.

FIG. 12A shows a cross sectional view of an embodiment of a composite MEMS transducer having a cantilevered beam 120 extending across a portion of cavity 115, where the cavity is a through hole from second surface 112 to first surface 111 of substrate 110. As in the embodiment of FIGS. 1 and 1B, compliant membrane 130 includes a first portion 131 that covers the MEMS transducing member, a second portion 132 that is anchored to first surface 111 of substrate 110, and a third portion 133 that overhangs cavity 115 while not contacting the MEMS transducing member. Additionally in the embodiment of FIG. 12A, the substrate further includes a second through hole 116 from second surface 112 to first surface 111 of substrate 110, where the second through hole 116 is located near cavity 115. In the example shown in FIG. 12A, no MEMS transducing member extends over the second through hole 116. In other embodiments where there is an array of composite MEMS transducers formed on substrate 110, the second through hole 116 can be the cavity of an adjacent MEMS composite transducer.

Figure 12B:
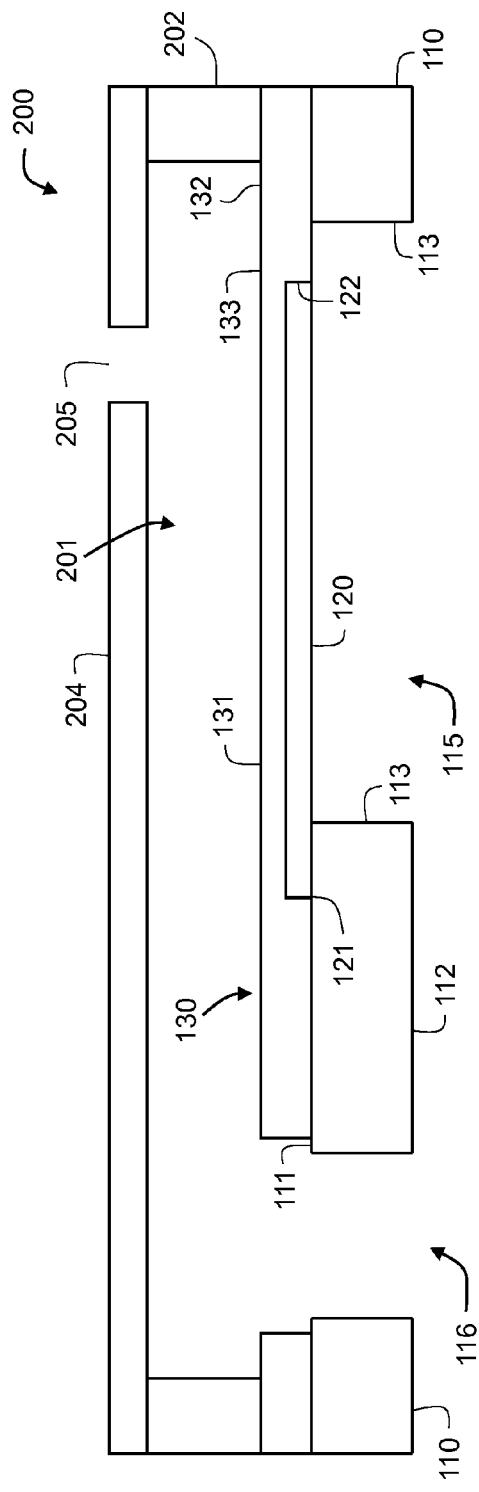
FIG. 12B is a cross-sectional view of a fluid ejector that incorporates the structure shown in FIG. 12A.

The configuration shown in FIG. 12A can be used in a fluid ejector 200 as shown in FIG. 12B. In FIG. 12B, partitioning walls 202 are formed over the anchored portion 132 of compliant membrane 130. In other embodiments (not shown), partitioning walls 202 are formed on first surface 111 of substrate 110 in a region where compliant membrane 130 has been removed. Partitioning walls 202 define a chamber 201. A nozzle plate 204 is formed over the partitioning walls and includes a nozzle 205 disposed near second end 122 of the cantilevered beam 120. Through hole 116 is a fluid feed that is fluidically connected to chamber 201, but not fluidically connected to cavity 115. Fluid is provided to cavity 201 through the fluid feed (through hole 116). When an electrical signal is provided to the MEMS transducing member (cantilevered beam 120) at an electrical connection region (not shown), second end 122 of cantilevered beam 120 and a portion of compliant membrane 130 are deflected upward and away from cavity 115 (as shown in FIG. 2), so that a drop of fluid is ejected through nozzle 205.

Figure 13:
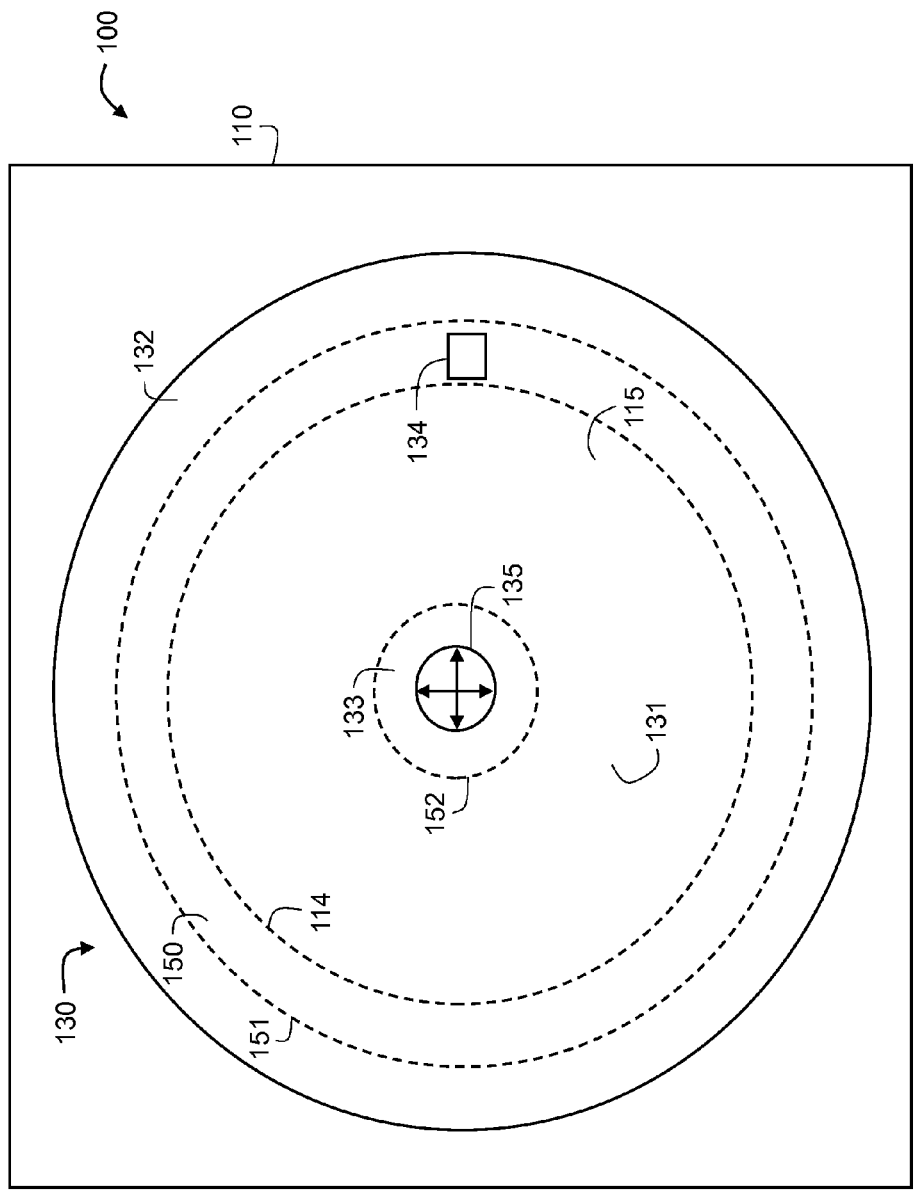
FIG. 13 is a top view of an embodiment similar to that of FIG. 10, but where the compliant membrane also includes a hole.
Figure 14:
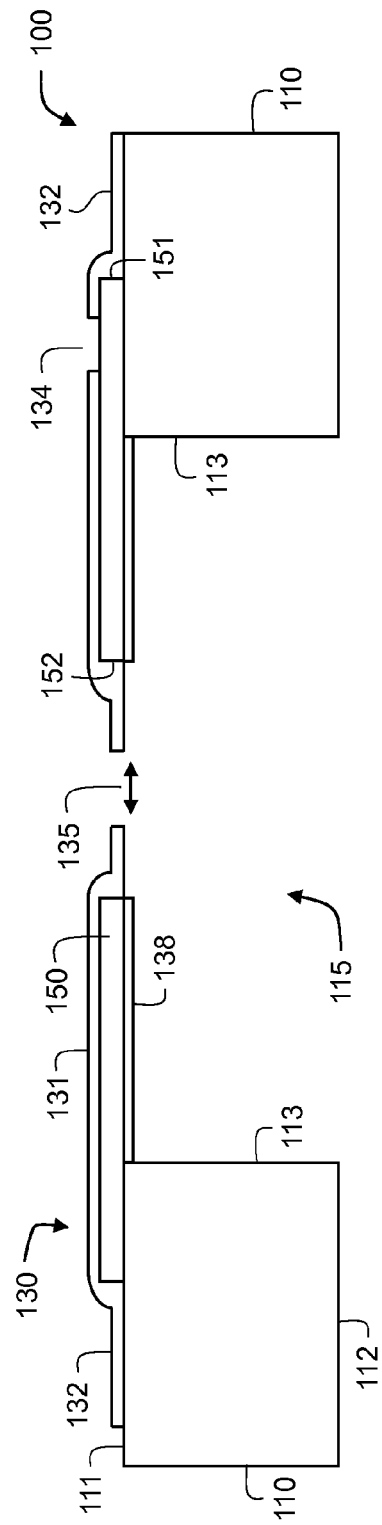
FIG. 14 is a cross-sectional view of the embodiment shown in FIG. 13.

The embodiment shown in FIG. 13 is similar to the embodiment of FIG. 10, where the MEMS transducing member is a clamped sheet 150, but in addition, compliant membrane 130 includes a hole 135 at or near the center of cavity 115. As also illustrated in FIG. 14, the MEMS composite transducer is disposed along a plane, and at least a portion of the MEMS composite transducer is movable within the plane. In particular, the clamped sheet 150 in FIGS. 13 and 14 is configured to expand and contract radially, causing the hole 135 to expand and contract, as indicated by the doubleheaded arrows. Such an embodiment can be used in a drop generator for a continuous fluid jetting device, where a pressurized fluid source is provided to cavity 115, and the hole 135 is a nozzle. The expansion and contraction of hole 135 stimulates the controllable break-off of the stream of fluid into droplets. Optionally, a compliant passivation material 138 can be formed on the side of the MEMS transducing material that is opposite the side that the portion 131 of compliant membrane 130 is formed on. Compliant passivation material 138 together with portion 131 of compliant membrane 130 provide a degree of isolation of the MEMS transducing member (clamped sheet 150) from the fluid being directed through cavity 115.

Figure 15:
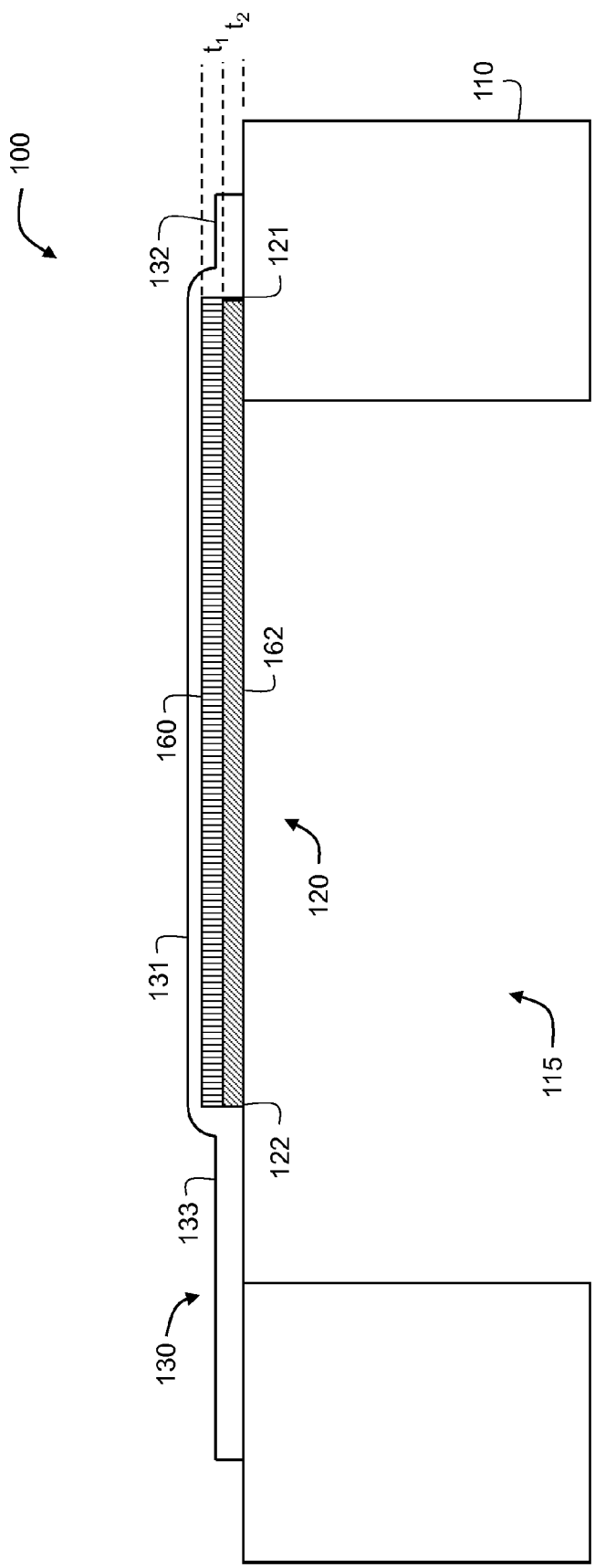
FIG. 15 is a cross-sectional view showing additional structural detail of an embodiment of a MEMS composite transducer including a cantilevered beam.

A variety of transducing mechanisms and materials can be used in the MEMS composite transducer of the present invention. Some of the MEMS transducing mechanisms include a deflection out of the plane of the undeflected MEMS composite transducer that includes a bending motion as shown in FIGS. 2, 8B and 11B. A transducing mechanism including bending is typically provided by a MEMS transducing material 160 in contact with a reference material 162, as shown for the cantilevered beam 120 in FIG. 15. In the example of FIG. 15, the MEMS transducing material 160 is shown on top of reference material 162, but alternatively the reference material 162 can be on top of the MEMS transducing material 160, depending upon whether it is desired to cause bending of the MEMS transducing member (for example, cantilevered beam 120) into the cavity 115 or away from the cavity 115, and whether the MEMS transducing material 160 is caused to expand more than or less than an expansion of the reference material 162.

One example of a MEMS transducing material 160 is the high thermal expansion member of a thermally bending bimorph. Titanium aluminide can be the high thermal expansion member, for example, as disclosed in commonly assigned U.S. Pat. No. 6,561,627. The reference material 162 can include an insulator such as silicon oxide, or silicon oxide plus silicon nitride. When a current pulse is passed through the titanium aluminide MEMS transducing material 160, it causes the titanium aluminide to heat up and expand. The reference material 160 is not self-heating and its thermal expansion coefficient is less than that of titanium aluminide, so that the titanium aluminide MEMS transducing material 160 expands at a faster rate than the reference material 162. As a result, a cantilever beam 120 configured as in FIG. 15 would tend to bend downward into cavity 115 as the MEMS transducing material 160 is heated. Dual-action thermally bending actuators can include two MEMS transducing layers (deflector layers) of titanium aluminide and a reference material layer sandwiched between, as described in commonly assigned U.S. Pat. No. 6,464,347. Deflections into the cavity 115 or out of the cavity can be selectively actuated by passing a current pulse through either the upper deflector layer or the lower deflector layer respectively.

A second example of a MEMS transducing material 160 is a shape memory alloy such as a nickel titanium alloy. Similar to the example of the thermally bending bimorph, the reference material 162 can be an insulator such as silicon oxide, or silicon oxide plus silicon nitride. When a current pulse is passed through the nickel titanium MEMS transducing material 160, it causes the nickel titanium to heat up. A property of a shape memory alloy is that a large deformation occurs when the shape memory alloy passes through a phase transition. If the deformation is an expansion, such a deformation would cause a large and abrupt expansion while the reference material 162 does not expand appreciably. As a result, a cantilever beam 120 configured as in FIG. 15 would tend to bend downward into cavity 115 as the shape memory alloy MEMS transducing material 160 passes through its phase transition. The deflection would be more abrupt than for the thermally bending bimorph described above.

A third example of a MEMS transducing material 160 is a piezoelectric material. Piezoelectric materials are particularly advantageous, as they can be used as either actuators or sensors. In other words, a voltage applied across the piezoelectric MEMS transducing material 160, typically applied to conductive electrodes (not shown) on the two sides of the piezoelectric MEMS transducing material, can cause an expansion or a contraction (depending upon whether the voltage is positive or negative and whether the sign of the piezoelectric coefficient is positive or negative). While the voltage applied across the piezoelectric MEMS transducing material 160 causes an expansion or contraction, the reference material 162 does not expand or contract, thereby causing a deflection into the cavity 115 or away from the cavity 115 respectively. Typically in a piezoelectric composite MEMS transducer, a single polarity of electrical signal would be applied however, so that the piezoelectric material does not tend to become depoled. It is possible to sandwich a reference material 162 between two piezoelectric material layers, thereby enabling separate control of deflection into cavity 115 or away from cavity 115 without depoling the piezoelectric material. Furthermore, an expansion or contraction imparted to the MEMS transducing material 160 produces an electrical signal which can be used to sense motion. There are a variety of types of piezoelectric materials. One family of interest includes piezoelectric ceramics, such as lead zirconate titanate or PZT.

As the MEMS transducing material 160 expands or contracts, there is a component of motion within the plane of the MEMS composite transducer, and there is a component of motion out of the plane (such as bending). Bending motion (as in FIGS. 2, 8B and 11B) will be dominant if the Young's modulus and thickness of the MEMS transducing material 160 and the reference material 162 are comparable. In other words, if the MEMS transducing material 160 has a thickness $t_1$, and if the reference material has a thickness $t_2$, then bending motion will tend to dominate if $t_2 > 0.5 t_1$ and $t_2 < 2 t_1$, assuming comparable Young's moduli. By contrast, if $t_2 < 0.2 t_1$, motion within the plane of the MEMS composite transducer (as in FIGS. 13 and 14) will tend to dominate.

Some embodiments of MEMS composite transducer 100 include an attached mass, in order to adjust the resonant frequency for example (see equation 2 in the background). The mass 118 can be attached to the portion 133 of the compliant membrane 130 that overhangs cavity 115 but does not contact the MEMS transducing member, for example. In the embodiment shown in the cross-sectional view of FIG. 16A including a plurality of cantilevered beams 120 (such as the configuration shown in FIG. 6), mass 118 extends below portion 133 of compliant membrane 130, so that it is located within the cavity 115. Alternatively, mass 118 can be affixed to the opposite side of the compliant membrane 130, as shown in FIG. 16B. The configuration of FIG. 16A can be particularly advantageous if a large mass is needed. For example, a portion of silicon substrate 110 can be left in place when cavity 115 is etched as described below. In such a configuration, mass 118 would typically extend the full depth of the cavity. In order for the MEMS composite transducer to vibrate without crashing of mass 118, substrate 110 would typically be mounted on a mounting member (not shown) including a recess below cavity 115. For the configuration shown in FIG. 16B, the attached mass 118 can be formed by patterning an additional layer over the compliant membrane 130.

Having described a variety of exemplary structural embodiments of MEMS composite transducers, a context has been provided for describing methods of fabrication. FIGS. 17A to 17E provide an overview of a method of fabrication. As shown in FIG. 17A, a reference material 162 and a transducing material 160 are deposited over a first surface 111 of a substrate 110, which is typically a silicon wafer. Further details regarding materials and deposition methods are provided below. The reference material 162 can be deposited first (as in FIG. 17A) followed by deposition of the transducing material 160, or the order can be reversed. In some instances, a reference material might not be required. In any case, it can be said that the transducing material 160 is deposited over the first surface 111 of substrate 110. The transducing material 160 is then patterned and etched, so that transducing material 160 is retained in a first region 171 and removed in a second region 172 as shown in FIG. 17B. The reference material 162 is also patterned and etched, so that it is retained in first region 171 and removed in second region 172 as shown in FIG. 17C.

As shown in FIG. 17D, a polymer layer (for compliant membrane 130) is then deposited over the first and second regions 171 and 172, and patterned such that polymer is retained in a third region 173 and removed in a fourth region 174. A first portion 173a, where polymer is retained is coincident with a portion of first region 171 where transducing material 160 is retained. A second portion 173b, where polymer is retained is coincident with a portion of second region 172 where transducing material 160 is removed. In addition, a first portion 174a, where polymer is removed is coincident with a portion of first region 171 where transducing material 160 is retained. A second portion 174b, where polymer is removed is coincident with a portion of second region 172 where transducing material 160 is removed. A cavity 115 is then etched from a second surface 112 (opposite first surface 111) to first surface 111 of substrate 110, such that an outer boundary 114 of cavity 115 at the first surface 111 of substrate 110 intersects the first region 171 where transducing material 160 is retained, so that a first portion of transducing material 160 (including first end 121 of cantilevered beam 120 in this example) is anchored to first surface 111 of substrate 110, and a second portion of transducing material 160 (including second end 122 of cantilevered beam 120) extends over at least a portion of cavity 115. When it is said that a first portion of transducing material 160 is anchored to first surface 111 of substrate 110, it is understood that transducing material 160 can be in direct contact (not shown) with first surface 111, or transducing material 160 can be indirectly anchored to first surface 111 through reference material 162 as shown in FIG. 17E. A MEMS composite transducer 100 is thereby fabricated.

Figure 18A:
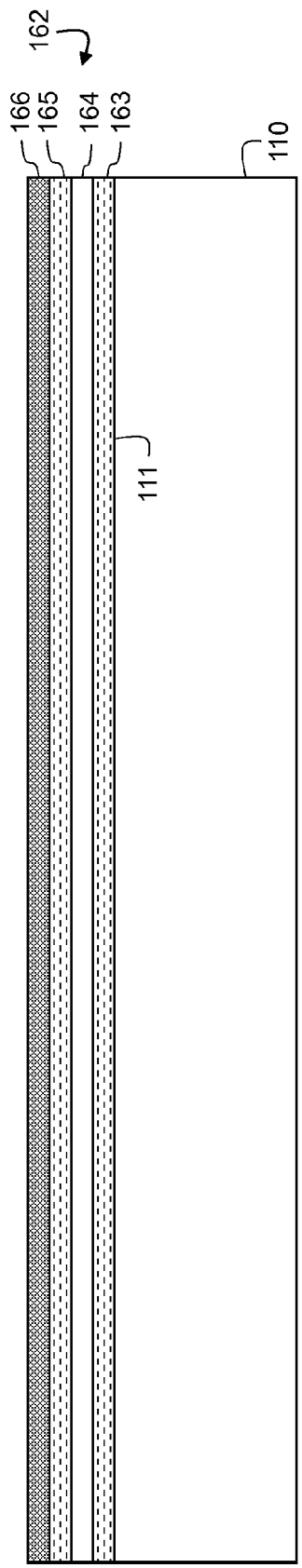
FIGS. 18A and 18B provide addition details of layers that can be part of the MEMS composite transducer.

Reference material 162 can include several layers as illustrated in FIG. 18A. A first layer 163 of silicon oxide can be deposited on first surface 111 of substrate 110. Deposition of silicon oxide can be a thermal process or it can be chemical vapor deposition (including low pressure or plasma enhanced CVD) for example. Silicon oxide is an insulating layer and also facilitates adhesion of the second layer 164 of silicon nitride. Silicon nitride can be deposited by LPCVD and provides a tensile stress component that will help the transducing material 160 to retain a substantially flat shape when the cavity is subsequently etched away. A third layer 165 of silicon oxide helps to balance the stress and facilitates adhesion of an optional bottom electrode layer 166, which is typically a platinum (or titanium/platinum) electrode for the case of a piezoelectric transducing material 160. The platinum electrode layer is typically deposited by sputtering.

Figure 18B:
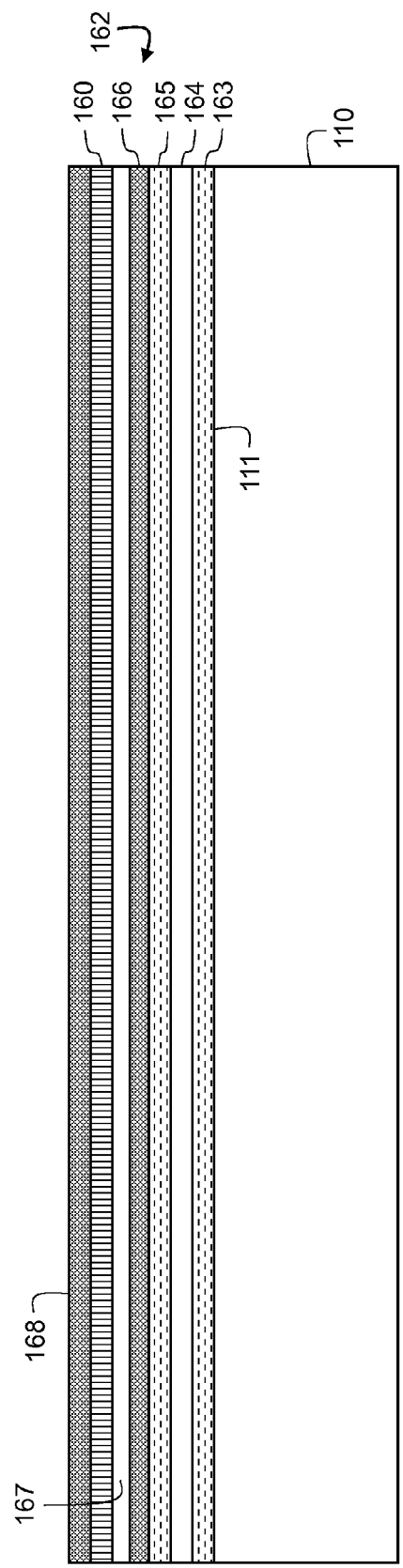

Deposition of the transducing material 160 will next be described for the case of a piezoelectric ceramic transducing material, such as PZT. An advantageous configuration is the one shown in FIG. 18B in which a voltage is applied across PZT transducing material 160 from a top electrode 168 to a bottom electrode 166. The desired effect on PZT transducing material 160 is an expansion or contraction along the x-y plane parallel to surface 111 of substrate 110. As described above, such an expansion or contraction can cause a deflection into the cavity 115 or out of the cavity 115 respectively, or a substantially in-plane motion, depending on the relative thicknesses and stiffnesses of the PZT transducing material 160 and the reference material 162. Thicknesses are not to scale in FIGS. 18A and 18B. Typically for a bending application where the reference material 162 has a comparable stiffness to the MEMS transducing material 160, the reference material 162 is deposited in a thickness of about 1 micron, as is the transducing material 160, although for in-plane motion the reference material thickness is typically 20% or less of the transducing material thickness, as described above. The transverse piezoelectric coefficients $d_{31}$, and $e_{31}$, are relatively large in magnitude for PZT (and can be made to be larger and stabilized if poled in a relatively high electric field). To orient the PZT crystals such that transverse piezoelectric coefficients $d_{31}$, and $e_{31}$, are the coefficients relating voltage across the transducing layer and expansion or contraction in the x-y plane, it is desired that the (001) planes of the PZT crystals be parallel to the x-y plane (parallel to the bottom platinum electrode layer 166 as shown in FIG. 18B). However, PZT material will tend to orient with its planes parallel to the planes of the material upon which it is deposited. Because the platinum bottom electrode layer 166 typically has its (111) planes parallel to the x-y plane when deposited on silicon oxide, a seed layer 167, such as lead oxide or lead titanate can be deposited over bottom electrode layer 166 in order to provide the (001) planes on which to deposit the PZT transducing material 160. Then the upper electrode layer 168 (typically platinum) is deposited over the PZT transducing material 160, e.g. by sputtering.

Deposition of the PZT transducing material 160 can be done by sputtering. Alternatively, deposition of the PZT transducing material 160 can be done by a sol-gel process. In the sal-gel process, a precursor material including PZT particles in an organic liquid is applied over first surface 111 of substrate 110. For example, the precursor material can be applied over first surface 111 by spinning the substrate 110. The precursor material is then heat treated in a number of steps. In a first step, the precursor material is dried at a first temperature. Then the precursor material is pyrolyzed at a second temperature higher than the first temperature in order to decompose organic components. Then the PZT particles of the precursor material are crystallized at a third temperature higher than the second temperature. PZT deposited by a sol-gel process is typically done using a plurality of thin layers of precursor material in order to avoid cracking in the material of the desired final thickness.

For embodiments where the transducing material 160 is titanium aluminide for a thermally bending actuator, or a shape memory alloy such as a nickel titanium alloy, deposition can be done by sputtering. In addition, layers such as the top and bottom electrode layers 166 and 168, as well as seed layer 167 are not required.

In order to pattern the stack of materials shown in FIGS. 18A and 18B, a photoresist mask is typically deposited over the top electrode layer 168 and patterned to cover only those regions where it is desired for material to remain. Then at least some of the material layers are etched at one time. For example, plasma etching using a chlorine based process gas can be used to etch the top electrode layer 168, the PZT transducing material 160, the seed layer 167 and the bottom electrode layer 166 in a single step. Alternatively the single step can include wet etching. Depending on materials, the rest of the reference material 162 can be etched in the single step. However, in some embodiments, the silicon oxide layers 163 and 165 and the silicon nitride layer 164 can be etched in a subsequent plasma etching step using a fluorine based process gas.

Depositing the polymer layer for compliant membrane 130 can be done by laminating a film, such as TMMF, or spinning on a liquid resist material, such as TMMR, as referred to above. As the polymer layer for the compliant membrane is applied while the transducers are still supported by the substrate, pressure can be used to apply the TMMF or other laminating film to the structure without risk of breaking the transducer beams. An advantage of TMMR and TMMF is that they are photopatternable, so that application of an additional resist material is not required. An epoxy polymer further has desirable mechanical properties as mentioned above.

In order to etch cavity 115 (FIG. 17E) a masking layer is applied to second surface 112 of substrate 110. The masking layer is patterned to expose second surface 112 where it is desired to remove substrate material. The exposed portion can include not only the region of cavity 115, but also the region of through hole 116 of fluid ejector 200 (see FIGS. 12A and 12B). For the case of leaving a mass affixed to the bottom of the compliant membrane 130, as discussed above relative to FIG. 16A, the region of cavity 115 can be masked with a ring pattern to remove a ring-shaped region, while leaving a portion of substrate 110 attached to compliant membrane 130. For embodiments where substrate 110 is silicon, etching of substantially vertical walls (portions 113 of substrate 110, as shown in a number of the cross-sectional views including FIG. 1B) is readily done using a deep reactive ion etching (DRIE) process. Typically, a DRIE process for silicon uses $SF_6$, as a process gas.

The invention has been described in detail with particular reference to certain preferred embodiments thereof, but it will be understood that variations and modifications can be effected within the scope of the invention.

PARTS LIST

100 MEMS composite transducer
110 Substrate
111 First surface of substrate
112 Second surface of substrate
113 Portions of substrate (defining outer boundary of cavity)
114 Outer boundary
115 Cavity
116 Through hole (fluid inlet)
118 Mass
120 Cantilevered beam
121 Anchored end (of cantilevered beam)
122 Cantilevered end (of cantilevered beam)
130 Compliant membrane
131 Covering portion of compliant membrane
132 Anchoring portion of compliant membrane
133 Portion of compliant membrane overhanging cavity
134 Portion where compliant membrane is removed
135 Hole (in compliant membrane)
138 Compliant passivation material
140 Doubly anchored beam
141 First anchored end
142 Second anchored end
143 Intersection region
150 Clamped sheet
151 Outer boundary (of clamped sheet)
152 Inner boundary (of clamped sheet)
160 MEMS transducing material
162 Reference material
163 First layer (of reference material)
164 Second layer (of reference material)
165 Third layer (of reference material)
166 Bottom electrode layer
167 Seed layer
168 Top electrode layer
171 First region (where transducing material is retained)
172 Second region (where transducing material is removed)
200 Fluid ejector
201 Chamber
202 Partitioning walls
204 Nozzle plate
205 Nozzle

The invention claimed is:

1. A method of fabricating a MEMS composite transducer, the method comprising:
providing a substrate having a first surface and a second surface opposite the first surface;
depositing a transducing material over the first surface of the substrate;
patterning the transducing material by retaining transducing material in a first region and removing transducing material in a second region;
depositing a polymer layer over the first and second regions;
patterning the polymer layer by retaining polymer in a third region and removing polymer in a fourth region, a first portion of the third region being coincident with a portion of the first region, and a second portion of the third region being coincident with a portion of the second region; and
etching a cavity from the second surface to the first surface of the substrate, wherein an outer boundary of the cavity at the first surface of the substrate intersects the first region where transducing material is retained, so that a first portion of the transducing material is anchored to the first surface of the substrate and a second portion of the transducing material extends over at least a portion of the cavity.

2. The method according to claim 1, wherein the substrate is silicon.

3. The method according to claim 1, further comprising depositing at least one insulating layer on the first surface of the substrate before the step of depositing the transducing material.

4. The method according to claim 3, the transducing material being deposited in a first thickness $t_1$ and the at least one insulating layer being deposited in a second thickness $t_2$, wherein $t_2 > 0.5\, t_1$ and $t_2 < 2t_1$.

5. The method according to claim 3, the transducing material being deposited in a first thickness $t_1$ and the at least one insulating layer being deposited in a second thickness $t_2$, wherein and $t_2 < 0.2t_1$.

6. The method according to claim 3 further comprising patterning the at least one insulating layer, wherein patterning the at least one insulating layer includes retaining insulating material in the first region where transducer material is retained.

7. The method according to claim 6, wherein patterning the at least one insulating layer comprises plasma etching the at least one insulating layer with a fluorine based process gas.

8. The method according to claim 3 further comprising depositing a first metal electrode layer after the at least one insulating layer is deposited and before the transducing material is deposited.

9. The method according to claim 8 further comprising depositing a second metal electrode layer after the transducing material is deposited.

10. The method according to claim 9, wherein patterning the transducing material further comprises etching the transducing material, the first metal electrode layer and the second metal electrode layer in a single step.

11. The method according to claim 10, wherein the single step etching comprises plasma etching using a chlorine based process gas.

12. The method according to claim 10, wherein the single step etching comprises wet etching.

13. The method according to claim 1, wherein depositing the transducing material comprises sputtering the transducing material.

14. The method according to claim 1 further comprising depositing a seed layer before the step of depositing the transducing material.

15. The method according to claim 1, wherein depositing the transducing material comprises a sol-gel process.

16. The method according to claim 15, wherein the sol-gel process comprises applying a precursor material over the first surface of the substrate.

17. The method according to claim 16, wherein the applying the precursor material comprises spinning the substrate.

18. The method according to claim 16, wherein the sol-gel process comprises heat-treating the deposited precursor material.

19. The method according to claim 18, wherein heat-treating the deposited precursor material comprises:
   drying the precursor material at a first temperature;
   pyrolyzing the precursor material at a second temperature higher than the first temperature to decompose organic components; and
   crystallizing remaining components of the precursor material at a third temperature higher than the second temperature.

20. The method according to claim 16, wherein the applying of precursor material comprises applying a plurality of thin layers of precursor material.

21. The method according to claim 1, wherein depositing the transducing material comprises depositing a piezoelectric material.

22. The method according to claim 21, wherein depositing the piezoelectric material further comprises depositing lead zirconate titanate.

23. The method according to claim 1, wherein depositing the transducing material comprises depositing a shape memory alloy material.

24. The method according to claim 23, wherein depositing the shape memory alloy material further comprises depositing a nickel titanium alloy.

25. The method according to claim 1, wherein depositing the transducing material comprises:
   depositing a first material having a first coefficient of thermal expansion; and
   depositing a second material in contact with the first material, the second material having a second coefficient of thermal expansion, the second coefficient of thermal expansion being greater that first coefficient of thermal expansion.

26. The method according to claim 25, wherein the first material comprises silicon oxide and the second material comprises titanium aluminide.

27. The method according to claim 1, wherein depositing the polymer layer comprises laminating a film.

28. The method according to claim 1, wherein depositing the polymer layer comprises spinning the wafer.

29. The method according to claim 1, wherein the polymer layer is photopatternable.

30. The method according to claim 1, wherein the polymer layer comprises an epoxy material.

31. The method according to claim 1 further comprising applying a masking layer to the second surface of the substrate, the masking layer exposing the second surface of the substrate in a first location where the cavity is to be etched.

32. The method according to claim 31, wherein the masking layer exposes the substrate in a second location where a through hole is to be etched from the second surface to the first surface.

33. The method according to claim 1, wherein etching the cavity further comprises deep reactive ion etching from the second surface of the substrate.

34. The method according to claim 33, wherein etching the cavity further comprises using $SF_6$ as a process gas.

* * * * *